United States Patent
Kim et al.

(10) Patent No.: US 12,150,334 B2
(45) Date of Patent: Nov. 19, 2024

(54) ORGANIC LIGHT-EMITTING DISPLAY APPARATUS HAVING CAVITY BETWEEN PROTECTION LAYER AND EDGE OF PIXEL ELECTRODE

(71) Applicant: SAMSUNG DISPLAY CO., LTD., Yongin-si (KR)

(72) Inventors: Taehyun Kim, Yongin-si (KR); Seunghwan Cho, Yongin-si (KR); Sangho Park, Yongin-si (KR); Seungmin Lee, Yongin-si (KR); Jungkyu Lee, Yongin-si (KR); Joosun Yoon, Yongin-si (KR); Jangdoo Lee, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 405 days.

(21) Appl. No.: 17/646,188

(22) Filed: Dec. 28, 2021

(65) Prior Publication Data
US 2022/0123262 A1 Apr. 21, 2022

Related U.S. Application Data

(62) Division of application No. 15/383,254, filed on Dec. 19, 2016, now Pat. No. 11,211,582.

(30) Foreign Application Priority Data

Jan. 15, 2016 (KR) .................... 10-2016-0005324
Jun. 3, 2016 (KR) .................... 10-2016-0069395

(51) Int. Cl.
*H10K 50/844* (2023.01)
*H10K 50/11* (2023.01)
(Continued)

(52) U.S. Cl.
CPC .......... *H10K 50/844* (2023.02); *H10K 50/11* (2023.02); *H10K 50/13* (2023.02); *H10K 50/15* (2023.02);
(Continued)

(58) Field of Classification Search
CPC .... H10K 50/844; H10K 50/13; H10K 59/122; H10K 50/11; H10K 59/121; H10K 50/15
See application file for complete search history.

(56) References Cited

U.S. PATENT DOCUMENTS

| 8,222,809 B2 | 7/2012 | Lee et al. |
| 8,227,816 B2 | 7/2012 | Kim et al. |

(Continued)

FOREIGN PATENT DOCUMENTS

| CN | 101471292 | 7/2009 |
| CN | 102087457 | 6/2011 |

(Continued)

OTHER PUBLICATIONS

Korean Office Action dated Nov. 23, 2017 (in Korean) issued by the Korean Intellectual Property Office in corresponding Korean Application No. 10-2016-0069395, 27 pages.

(Continued)

*Primary Examiner* — Michael Jung
(74) *Attorney, Agent, or Firm* — F. CHAU & ASSOCIATES, LLC

(57) ABSTRACT

A thin film transistor is disposed on a substrate. A via insulating layer having a via hole covers the thin film transistor. A pixel electrode is disposed on the via insulating layer and electrically connected to the thin film transistor through the via hole. A first protection layer surrounds the pixel electrode. A pixel-defining layer covers an edge region of the pixel electrode and at least a portion of the first protection layer. The pixel-defining layer includes an open- (Continued)

ing through which an upper surface of the pixel electrode is exposed. An opposite electrode faces the pixel electrode. An intermediate layer is disposed between the pixel electrode and the opposite electrode.

5 Claims, 20 Drawing Sheets

(51) Int. Cl.
*H10K 50/13* (2023.01)
*H10K 50/15* (2023.01)
*H10K 59/121* (2023.01)
*H10K 59/122* (2023.01)
*H10K 50/81* (2023.01)
*H10K 59/12* (2023.01)

(52) U.S. Cl.
CPC ......... *H10K 59/121* (2023.02); *H10K 59/122* (2023.02); *H10K 50/81* (2023.02); *H10K 59/1201* (2023.02)

(56) References Cited

U.S. PATENT DOCUMENTS

| | | | |
|---|---|---|---|
| 8,378,349 | B2 | 2/2013 | Ko et al. |
| 8,441,178 | B2 | 5/2013 | Choi |
| 8,487,301 | B2 | 7/2013 | Choi et al. |
| 8,530,268 | B2 | 9/2013 | Kim |
| 8,664,659 | B2 | 3/2014 | Kang et al. |
| 9,076,739 | B2 | 7/2015 | Choi et al. |
| 9,171,892 | B2 | 10/2015 | Kwon et al. |
| 9,356,079 | B2 | 5/2016 | Choi et al. |
| 9,711,750 | B1 | 7/2017 | Kim et al. |
| 9,893,318 | B2 | 2/2018 | Dai et al. |
| 2004/0119071 | A1 | 6/2004 | Takahara |
| 2005/0285509 | A1 | 12/2005 | Funamoto et al. |
| 2006/0062270 | A1 | 3/2006 | Okutani et al. |
| 2009/0170230 | A1 | 7/2009 | Kidu et al. |
| 2009/0174320 | A1 | 7/2009 | Kim |
| 2010/0045173 | A1 | 2/2010 | Kwon et al. |
| 2011/0127500 | A1 | 6/2011 | Ko et al. |
| 2013/0049028 | A1 | 2/2013 | Kim et al. |
| 2014/0034923 | A1 | 2/2014 | Kim et al. |
| 2014/0346457 | A1 | 11/2014 | Oh et al. |
| 2014/0361253 | A1 | 12/2014 | Choi et al. |
| 2015/0188093 | A1 | 7/2015 | Kim et al. |
| 2015/0280171 | A1 | 10/2015 | Ko et al. |
| 2016/0043341 | A1* | 2/2016 | Heo ................. H10K 59/80522 438/23 |
| 2016/0099300 | A1 | 4/2016 | Lee et al. |
| 2016/0293683 | A1 | 10/2016 | Hou et al. |
| 2017/0053973 | A1 | 2/2017 | Park et al. |
| 2017/0207416 | A1 | 7/2017 | Kim et al. |

FOREIGN PATENT DOCUMENTS

| | | |
|---|---|---|
| CN | 104103786 | 10/2014 |
| CN | 104218050 | 12/2014 |
| JP | 2010-165612 | 7/2010 |
| KR | 10-2004-0106806 | 12/2004 |
| KR | 10-2006-0025883 | 3/2006 |
| KR | 10-2006-0060462 | 6/2006 |
| KR | 10-2007-0047978 | 5/2007 |
| KR | 10-2008-0086201 | 9/2008 |
| KR | 10-0908236 | 7/2009 |
| KR | 10-2010-0022406 | 3/2010 |
| KR | 10-2010-0088268 | 8/2010 |
| KR | 10-2011-0060474 | 6/2011 |
| KR | 10-2012-0004783 | 1/2012 |
| KR | 10-2012-0019024 | 3/2012 |
| KR | 10-2015-0145834 | 12/2015 |
| KR | 10-2017-0023268 | 3/2017 |
| KR | 10-2017-0090014 | 8/2017 |

OTHER PUBLICATIONS

Registration Determination Certificate issued by the Korean Intellectual Property Office on May 17, 2018 for the corresponding Korean Patent Application No. 10-2016-069395 (2 pages in Korean). Chinese Office Action Dated Dec. 27, 2019 For Application Serial No. 201710028213.9.

* cited by examiner

ORGANIC LIGHT-EMITTING DISPLAY APPARATUS HAVING CAVITY BETWEEN PROTECTION LAYER AND EDGE OF PIXEL ELECTRODE

CROSS-REFERENCE TO RELATED APPLICATIONS

This application is a divisional of U.S. patent application Ser. No. 15/383,254 filed on Dec. 19, 2016 in the U.S. Patent and Trademark Office, which claims priority under 35 U.S.C. § 119 from Korean Patent Application No. 10-2016-0005324, filed on Jan. 15, 2016 and No. 10-2016-0069395, filed on Jun. 3, 2016 in the Korean Intellectual Property Office, the disclosures of both of which are incorporated by reference herein in their entireties.

TECHNICAL FIELD

The present invention relates to an organic light-emitting display apparatus and a method of manufacturing the same.

DISCUSSION OF RELATED ART

Organic light-emitting display apparatuses include an organic light-emitting diode (OLED) that includes a hole injection electrode, an electron injection electrode, and an organic emission layer between the hole injection electrode and the electron injection electrode. In addition, organic light-emitting display apparatuses are self-emissive. In the organic emission layer, holes injected through the hole injection electrode and electrons injected through the electron injection electrode combine with each other to generate excitons that fall from an excited state to a ground state to generate light.

The organic light-emitting display apparatuses do not need a light source and thus can be driven with a low voltage and manufactured to be lightweight and thin. In addition, since the organic light-emitting display apparatuses have favorable characteristics such as wide viewing angles, high contrast, and fast response, fields to which the organic light-emitting display apparatuses are applied have been recently expanded from personal portable devices to TVs.

SUMMARY

According to an exemplary embodiment of the present invention, an organic light-emitting display apparatus is provided as follows. A thin film transistor is disposed on a substrate. A via insulating layer having a via hole covers the thin film transistor. A pixel electrode is disposed on the via insulating layer and electrically connected to the thin film transistor through the via hole. A first protection layer surrounds the pixel electrode. A pixel-defining layer covers an edge region of the pixel electrode and at least a portion of the first protection layer. The pixel-defining layer includes an opening through which an upper surface of the pixel electrode is exposed. An opposite electrode faces the pixel electrode. An intermediate layer is disposed between the pixel electrode and the opposite electrode.

According to an exemplary embodiment of the present invention, a method of manufacturing an organic light-emitting display apparatus is provided as folios. A thin film transistor is formed on a substrate. A via insulating layer having a via hole is formed to cover the thin film transistor. A conductive material layer is formed on the via insulating layer, the conductive material layer being connected to the thin film transistor through the via hole of the via insulating layer. A first photosensitive pattern layer is formed on the conductive material layer. The first photosensitive pattern layer includes a first region and a second region that surrounds the first region. The conductive material layer is patterned by using the first photosensitive pattern layer to form a pixel, electrode. A first protection layer is formed to surround the pixel electrode. A pixel-defining layer is formed by removing the first region of the first photosensitive pattern layer, the pixel-defining layer exposing an upper surface of the pixel electrode and covering an edge region of the pixel electrode. An intermediate layer is formed on the pixel electrode. An opposite electrode is formed on the intermediate layer.

According to an exemplary embodiment of the present invention, an organic light-emitting display apparatus is provided as follows. A thin film transistor is disposed on a substrate. A via insulating layer having a via hole covers the thin film transistor. A pixel electrode is disposed on the via insulating layer and electrically connected to the thin film transistor through the via hole. An emission layer is disposed on an upper surface of the pixel electrode. A pixel-defining layer is disposed on the upper surface of the pixel electrode, surrounding the emission layer. An opposite electrode is disposed on the emission layer and the pixel-defining layer. A recessed region is defined by a bottom surface of the pixel electrode, an edge of the pixel electrode and the via insulating layer. The opposite electrode is spaced apart from the pixel electrode by the recessed region.

BRIEF DESCRIPTION OF DRAWINGS

These and other features of the present invention will become more apparent by describing in detail exemplary embodiments thereof with reference to the accompanying drawings of which.

DETAILED DESCRIPTION OF EXEMPLARY EMBODIMENTS

Figure 1:
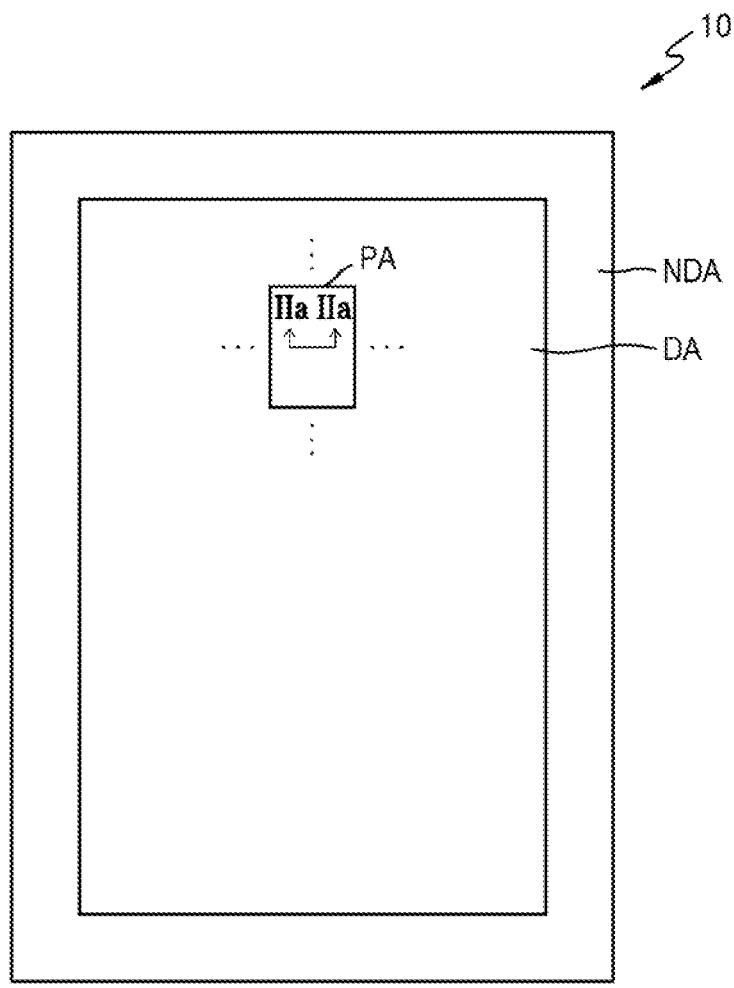
FIG. 1 is a schematic plan view of an organic light-emitting display apparatus according to an exemplary embodiment of the present invention.

Exemplary embodiments of the present invention will be described below in detail with reference to the accompanying drawings. However, the present invention may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIG. 1 is a schematic plan view of an organic light-emitting display apparatus 10 according to an exemplary embodiment of the present invention.

Referring to FIG. 1, the organic light-emitting display apparatus 10 includes a display area DA and a non-display area NA that is adjacent to the display area DA. The display area DA includes a plurality of pixel areas PA, and a pixel that emits light is formed on each pixel area PA. An image is provided via lights that are emitted by the plurality of pixels included in the display area DA.

The non-display area NDA may surround the display area DA, and may include a driving unit, such as a scan driving unit (not shown) and a data driving unit (not shown) for transmitting a predetermined signal to the plurality of pixels included in the display area DA.

Although the non-display area NDA surrounds the display area DA in FIG. 1, the present invention is not limited thereto. For example, the non-display region NDA may be disposed on one side of the display area DA to reduce a region on which no images area displayed, namely, a dead region.

Figure 2:
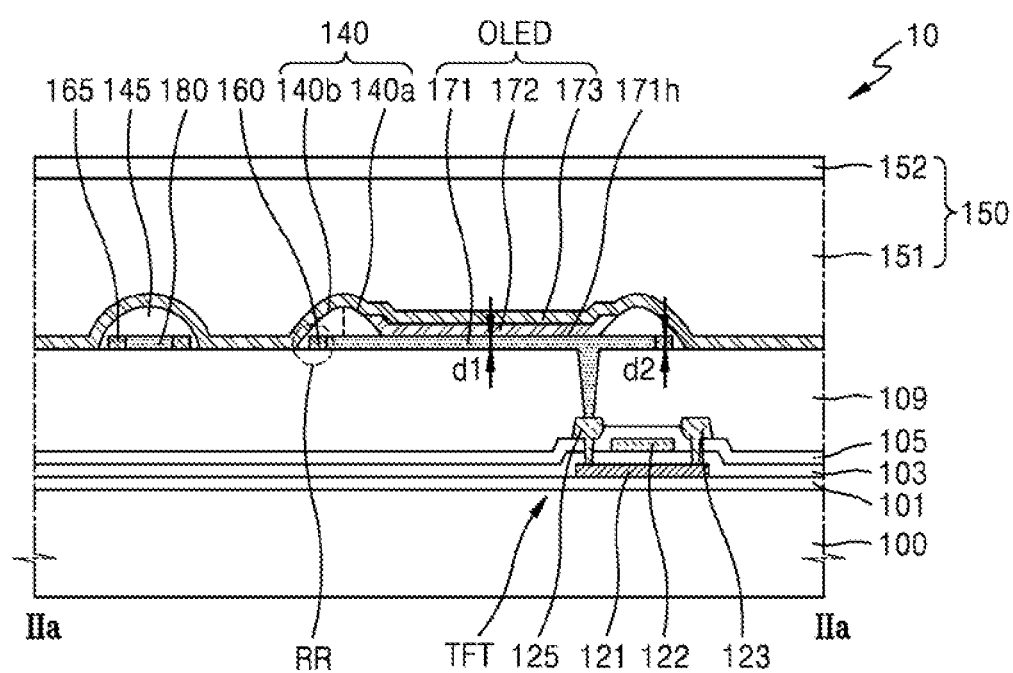
FIG. 2 is a cross-sectional view taken along line IIa-IIa of FIG. 1 according to an exemplary embodiment of the present invention.
Figure 3:
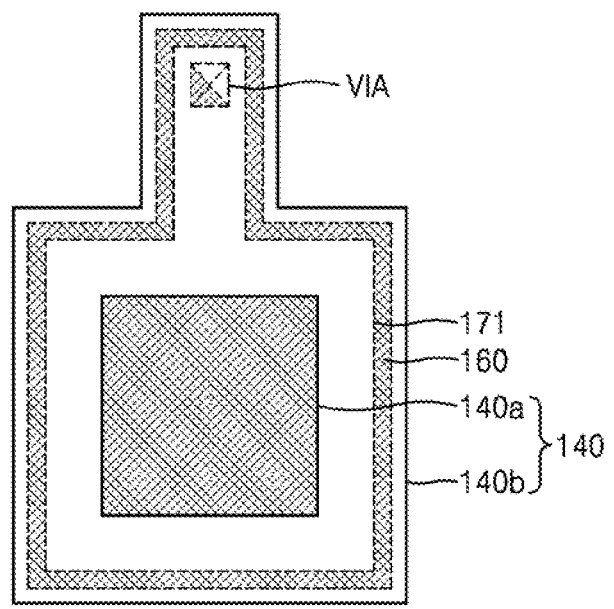
FIG. 3 is a schematic plan view of an arrangement of a pixel electrode, a first protection layer, and a pixel-defining layer of FIG. 2.

FIG. 2 is a cross-sectional view taken along line IIa-IIa of FIG. 1, and FIG. 3 is a schematic plan view of an arrangement of a pixel electrode 171, a first protection layer 160, and a pixel-defining layer 140 of FIG. 2.

Referring to FIG. 2, the organic light-emitting display apparatus 10 according to an exemplary embodiment includes a substrate 100, a thin film transistor TFT on the substrate 100, a via insulating layer 109 covering the thin film transistor TFT, the pixel, electrode 171 disposed on the via insulating layer 109 and electrically connected to the thin film transistor TFT, the first protection layer 160 disposed along an edge of the pixel electrode 171, the pixel-defining layer 140 covering at least one region of the first protection layer 160 and an edge region of the pixel electrode 171 and including an opening 171h via which the center of the pixel electrode 171 is exposed, an opposite electrode 173 facing the pixel electrode 171, and an intermediate layer 172 between the pixel electrode 171 and the opposite electrode 173.

The substrate 100 may be a glass substrate. The present invention is not limited thereto. For example, the substrate 100 may be a plastic substrate including polyethylene terephthalate (PET), polyethylene naphthalate (PEN), polyimide, or the like. According to an exemplary embodiment, the substrate 100 may include a flexible substrate 100. The flexible substrate 100 is referred to as a substrate that is bent, folded, or rolled. The flexible substrate 100 may be formed of ultra-thin glass, metal, or plastic.

A buffer layer 101 may be further formed on the substrate 100 to secure the smoothness of the substrate 100 and to prevent penetration of impurity elements from the substrate 100. The buffer layer 101 may include multiple layers or a single layer including silicon nitride and/or silicon oxide. The thin film transistor TFT may be disposed on the display area DA of the buffer layer 101. A barrier layer (not shown) may be further between the substrate 100 and the buffer layer 101, and the buffer layer 101 may be omitted as necessary.

The thin film transistor TFT may function as a portion of a driving circuit unit for driving an organic light-emitting diode OLEO. The driving circuit unit may further include a capacitor and a wiring except for the thin film transistor TFT. The capacitor may be provided in plural. The wiring may be provided in plural.

The thin film transistor TFT may include an active layer 121 disposed on the buffer layer 101, a gate electrode 122 disposed on at least a portion of the active layer 121, a source electrode 123 to which a data signal is applied, and a drain electrode 125 electrically connected to the pixel electrode 171. A gate insulating layer 103 is between the active layer 121 and the gate electrode 122, and an interlayer insulating layer 105 is between the gate electrode 122 and the source and drain electrodes 123 and 125.

The active layer 121 includes a semiconductor material, and may include, for example, amorphous silicon or polycrystalline silicon. However, the present invention is not limited thereto. For example, the active layer 121 may include an organic semiconductor material or an oxide semiconductor material.

The gate electrode 122 may be connected to a gate line (not shown) that applies an ON/OFF signal to the thin film transistor TFT. The gate electrode 122 may be formed of a low-resistance metal material such as aluminum (Al) platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu). The gate electrode 122 may be formed in a single- or multi-layered structure.

Each of the source and drain electrodes 123 and 125 may be a n e layer or multiple layers formed of a conductive material. The source and drain electrodes 123 and 125 may be connected to a source region and a drain region of the active layer 121, respectively. The source electrode 123 and the drain electrode 125 may each be formed of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), or copper (Cu). The source electrode 123 and the drain electrode 125 may be formed in a single-layered or multi-layered structure.

The thin film transistor TFT according to an exemplary embodiment is of a top gate type in which the gate electrode 122 is disposed on the active layer 121, but the present invention is not limited thereto. For example, the thin film transistor TFT may be of a bottom gate type in which the gate electrode 122 is disposed below the active layer 121.

Each of the gate insulating layer 103 and the interlayer insulating layer 105 may be a single layer or multiple layers formed of an inorganic material. For example, each of the gate insulating layer 103 and the interlayer insulating layer 105 may include silicon oxide ($SiO_2$) silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zirconium oxide ($ZrO_2$).

The buffer layer 101, the gate insulating layer 103, and the interlayer insulating layer 105 may be formed not only in the display area DA but also in a portion of the non-display area NDA. According to an exemplary embodiment, the buffer layer 101, the gate insulating layer 103, and the interlayer insulating layer 105 may be disposed on a region of the substrate 100 except for an outermost edge region thereof.

The via insulating layer 109 may cover the thin film transistor TFT, and may mitigate a step difference caused by the thin film transistor TFT and have a planarized upper surface. The via insulating layer 109 may be a single layer or multiple layers formed of an organic material. However, the present invention is not limited thereto. For example, the via insulating layer 109 may be a stack of inorganic insulating layers and organic insulating layers.

The pixel electrode 171 electrically connected to the thin film transistor TFT through via holes VIA formed in the via insulating layer 109 may be disposed on the via insulating layer 109. The pixel electrode 171 according to an exemplary embodiment is electrically connected to the drain electrode 125, but the present invention is not limited thereto. For example, the pixel electrode 171 may be electrically connected to the source electrode 123.

The pixel electrode 171 may be formed of a material having a high work function. In bottom-emission type displays displaying an image in a direction of the substrate 100, the pixel electrode 171 may include a transparent conductive oxide such as indium tin oxide (ITO), indium zinc oxide (IZO), zinc oxide (ZnO), indium oxide ($In_2O_3$), indium gallium oxide (IGO), and aluminum zinc oxide (AZO).

According to an exemplary embodiment, in top-emission type displays displaying an image in a direction of the opposite electrode 173, the pixel electrode 171 may include a transparent conductive oxide such as ITO, IZO, ZnO, $In_2O_3$, IGO, and AZO and may further include a metal reflection layer such as silver (Ag), magnesium (Mg), aluminum (Al), platinum (Pt), palladium (Rd), gold (Au), nickel (NO, neodymium (Nd), iridium (Ir), and chromium (Cr).

The pixel-defining layer 140 may cover the at least one region of the first protection layer 160 and the edge region of the pixel electrode 171, and may include the opening 171h via which the center of the pixel electrode 171 is exposed. The pixel-defining layer 140 covers the edge region of the pixel electrode 171 to insulate the pixel, electrode 171 from the opposite electrode 173. The pixel-defining layer 140 may be disposed on the edge region of the pixel electrode 171, surrounding the pixel electrode 17t The pixel-defining layer 140 may a donut shape or a rectangular frame shape as viewed from the above. The pixel-defining layer 140 may include a photosensitive organic material, for example, polyimide (PI), Since the organic light-emitting display apparatus 10 according to an exemplary embodiment of the present invention includes the pixel electrode 171 and the pixel-defining layer 140 formed using a single photomask, the center of the pixel-defining layer 140 may coincide with the center of the opening 171h of the pixel electrode 171.

The pixel-defining layer 140 may include a first surface 140a directed toward the opening 171h and a second surface 140b located opposite to the first surface 140a and covering the edge region of the pixel electrode 171. The first surface 140a and the second surface 140b of the pixel-defining layer 140 may be inclined. The first surface 140a may be referred to as an inner lateral surface, and the second surface 140b may be referred to as an outer lateral surface.

The first surface 140a may extend from a region where an upper surface of the pixel electrode 171 contacts the opening 171h in a direction away from the substrate 100, and the second surface 140b may extend from the first surface 140a in a direction toward the substrate 100. The direction away from the substrate 100 and the direction toward the substrate 100 do not mean the direction exactly perpendicular to the upper surface of the substrate 100, and means directions inclined at a predetermined angle with respect to the upper surface of the substrate 100.

The first protection layer 160 may surround the pixel electrode 171. For example, the first protection layer 160 may surround the edge of the pixel electrode 171 and shield the edge of the pixel electrode 171 together with the pixel-defining layer 140. The first protection layer 160 may be a single layer or multiple layers formed of an inorganic insulating material. For example, the first protection layer 160 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zirconium oxide ($ZrO_2$). According to an exemplary embodiment, the first protection layer 160 may be a single layer or multiple layers including an organic insulating material. For example, the first protection layer 160 may include polyimide (PI) and siloxane.

A thickness d2 of the first protection layer 160 may be substantially the sane as a thickness d1 of the pixel electrode 171. Since the thickness d2 of the first protection layer 160 is equal to the thickness d1 of the pixel electrode 171, the first protection layer 160 may shield the edge of the pixel electrode 171 to prevent exposure of the edge of the pixel electrode 171 and the first protection layer 160 together with the edge region of the pixel electrode 171 may be sufficiently covered by the pixel-defining layer 140.

In an exemplary embodiment, a recessed region RR is disposed between a bottom surface of the pixel-defining layer 140 and an upper surface of the via insulating layer 109. For example, the recessed region RR is defined by a bottom surface of the pixel-defining layer 140, an edge of the pixel electrode 171 and the upper surface of the via insulating layer 109. The opposite electrode 173 may be spaced apart from the pixel electrode 171 by the recessed region RR. The formation of the recessed region RR will be described later with reference to FIGS. 8D and 10C. In FIG. 80, the recessed region RR may be formed by over-etching. In FIG. 10C, the recessed region RR may be formed by a reflowing process to form a protrusion 1401.

Referring to FIG. 3, the first protection layer 160 may be disposed around the pixel electrode 171 and thus may contact the edge of the pixel electrode 171. The first protection layer 160 may be disposed in a closed loop shape surrounding the edge of the pixel electrode 171. The closed loop shape may include an inner surface and an outer surface. In this case, the inner surface of the first protection layer 160 may contact the edge of the pixel electrode 171.

The pixel-defining layer 140 may cover at least one region of the first protection layer 160. According to an exemplary embodiment, the pixel-defining layer 140 may completely cover the upper surface of the first protection layer 160. In this case, the first protection layer 160 may be between the second surface 140b of the pixel-defining layer 140 and the via insulating layer 109.

The first protection layer 160 may have a shape of a closed loop comprising an inner lateral surface and an outer lateral surface.

According to a comparative embodiment, the pixel-defining layer 140 may expose the edge region of the pixel electrode 171 due to a manufacturing process deviation. In this case, an organic light-emitting display apparatus according to a comparative embodiment may have defective pixels due to an exposed portion of the pixel electrode 171.

However, in the organic light-emitting display apparatus 10 according to an exemplary embodiment of the present invention, since the first protection layer 160 is disposed around the edge of the pixel electrode 171, even when the pixel-defining layer 140 does not cover the edge region of the pixel electrode 171 the first protection layer 160 may shield the edge of the pixel electrode 171.

The intermediate layer 172 may be disposed on a region of the pixel electrode 171 that is not covered by the pixel-defining layer 140.

The intermediate layer 172 may include a low molecular organic material or a high molecular organic material. At least one of a hole injection layer (HIL), a hole transport layer (HTL), an electron transport layer (ETL), and an electron injection layer (EIL), in addition to the intermediate layer 172, may be further disposed between the pixel electrode 171 and the opposite electrode 173. According to an exemplary embodiment, various functional layers other than the aforementioned layers may be further disposed between the pixel electrode 171 and the opposite electrode 173.

The intermediate layer 172 may be disposed in each organic light-emitting diode OLED, and the organic light-emitting diode OLED may emit red, green, or blue light according to the type of organic emission layer 172b included in the organic light-emitting diode OLED. However, the present invention is not limited thereto. For example, a plurality of intermediate layers 172 may be disposed on a single organic light-emitting diode OLED. For example, intermediate layers 172 respectively emitting red, green, and blue lights may be stacked vertically or combined to emit white light. In this case, the organic light-emitting display apparatus 10 may further include a color-converting layer or a color filter that converts the white light into light of a predetermined color. The red, green, and blue colors are exemplary, and thus a color combination for emitting white light is not limited thereto.

The opposite electrode 173 may be disposed on the intermediate layer 172 and may be formed of various conductive materials. For example, the opposite electrode 173 may include a single layer or multiple layers including lithium (Li), calcium (Ca), lithium fluoride (LiF), aluminum (Al) magnesium (Mg), or silver (Ag). In bottom-emission type displays, the opposite electrode 173 may be a reflective electrode. In top-emission type displays, the opposite electrode 173 may be a transparent or semitransparent electrode.

According to are exemplary embodiment, a thin-film encapsulation layer 150 may be disposed on the opposite electrode 173 in order to encapsulate the organic light-emitting diode OLED, the thin-film encapsulation layer 150 including at least one organic layer 151 and at least one inorganic layer 152. The thin-film encapsulation layer 150 encapsulates the organic light-emitting device OLED to prevent the organic light-emitting diode OLED from being exposed to external air or a foreign material. Since the thin-film encapsulation layer 150 is thin, the thin-film encapsulation layer 150 may be used as an encapsulating means of flexible displays that are bendable or foldable.

According to an exemplary embodiment, the inorganic layer 152 may include oxide, nitride, or oxynitride, such as silicon nitride (SiNx), silicon oxide (SiO$_2$) or silicon oxynitride (SiOxNy). The inorganic layer 152 may serve to block or reduce permeation of foreign materials, such as moisture or oxygen, to the organic light-emitting diode OLED, and may extend from the display area DA to the non-display area NDA.

In the non-display area NDA, at least one portion of the inorganic layer 152 may directly contact the interlayer insulating layer 105. The inorganic layer 152 may extend to an outermost edge region of the substrate 100 which deviates respective ends of the gate insulating layer 103 and the interlayer insulating layer 105, and the inorganic layer 152 may include a region that directly contacts the upper surface of the substrate 100.

For example, an edge region of the inorganic layer 152 contacts the upper surface of the substrate 100, and thus detachment of the inorganic layer 152 from the interlayer insulating layer 105 is reduced or prevented. As such, the encapsulation characteristics of the thin-film encapsulation layer 150 may be increased.

The organic layer 151 of the thin-film encapsulation layer 150 may be disposed between the opposite electrode 173 and the inorganic layer 152, and may block or reduce permeation of foreign materials, such as moisture or oxygen, into the organic light-emitting diode OLED. The organic layer 151 may be used together with the inorganic layer 152 to increase a level of protection from foreign materials, and may planarize an unsmooth surface. According to an exemplary embodiment, the organic layer 151 may include any of various organic materials, such as epoxy-based resin, acryl-based resin, and polyimide-based resin.

According to an exemplary embodiment, a functional layer (not shown) and a protection layer (not shown) may be further disposed between the opposite electrode 173 and the thin-film encapsulation layer 150. The functional layer may include a capping layer (not shown) and/or an LiF layer (not shown) for increasing luminescent efficiency by controlling the refractive index of visible light emitted from the organic light-emitting diode OLEO. The protection layer may include an inorganic material, such as aluminum oxide.

According to an exemplary embodiment, the organic light-emitting display apparatus 10 may further include a line 180, a second protection layer 165, and a line insulating layer 145.

The line 180, formed of the same material as the material used to form the pixel electrode 171, may be disposed at the same level as the pixel electrode 171, on the via insulating layer 109. The line 180 may be spaced apart from the pixel electrode 171. The line 180 may be a data line or an initializing voltage line. The line 180 may be electrically connected to a line on a different layer from the line 180 and thus may serve as an auxiliary wire.

The second protection layer 165, formed of the same material as the material used to form the first protection layer 160, may be disposed along an, edge of the line 180. The second protection layer 165 shields the edge of the line 180 to prevent the edge of the line 180 from being exposed. The second protection layer 165 may be disposed on both edges of the line 180.

The line insulating layer 145 may completely cover the line 180 including at least one region of the second protection layer 165. The line insulating layer 145 may be formed of the same material as the material used to form the pixel-defining layer 140, at the same level as the pixel-defining layer 140, and may be spaced apart from the pixel-defining layer 140. According to an exemplary embodiment, the line insulating layer 145 may completely cover an upper surface of the second protection layer 165. Due to the line insulating layer 145 completely covering the line 180 including the second protection layer 165, defective pixels that may be generated due to exposure of an edge region of the line 180 may be reduced.

Organic light-emitting display apparatuses according to exemplary embodiments of the present invention will now be described with reference to FIGS. 4-7.

FIGS. 4-7 are schematic cross-sectional views of organic light-emitting display apparatuses 20, 30, 40, and 50 according to exemplary embodiments of the present invention. In the description below with reference to FIGS. 4-7, like reference numerals or characters are assigned to components the same as or corresponding to those of the organic light-emitting display apparatus 10 of FIG. 2, and descriptions of the same or corresponding components will not be repeated herein.

Figure 4:
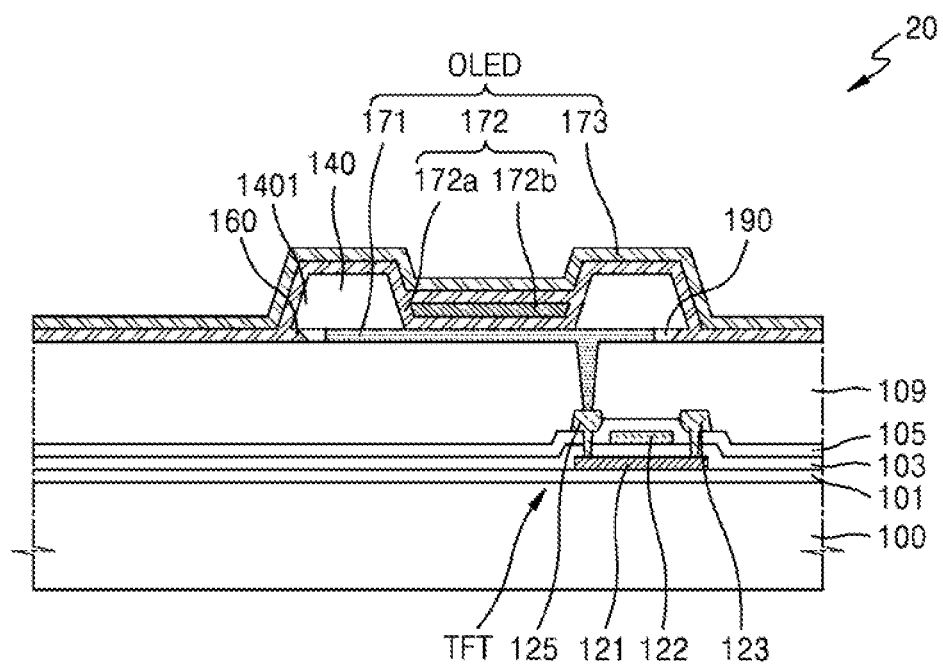
FIGS. 4-7 are schematic cross-sectional views taken along line IIa-IIa of FIG. 1 according to exemplary embodiments of the present invention.

Referring to FIG. 4, the organic light-emitting display apparatus 20 according to an exemplary embodiment of the present invention may include a thin film transistor TFT on the substrate 100, a pixel electrode 171 electrically connected to the thin film transistor TFT, a pixel-defining layer 140 formed on an edge region of the pixel electrode 171, an opposite electrode 173 disposed opposite to the pixel electrode 171, and an intermediate layer 172 formed between the pixel electrode 171 and the opposite electrode 173.

The intermediate layer 172 may be formed between the pixel electrode 171 and the opposite electrode 173 and may include an emission layer 172b.

According to an exemplary embodiment, the intermediate layer 172 may include the emission layer 172b and may further include a common layer 172a which include an HIL, an a hole blocking layer (Buffer), an ETL, or an EIL. The present invention is not limited thereto. For example, the intermediate layer 172 may include a common layer 172a executing various functions, in addition to the emission layer 172b.

According to an exemplary embodiment, an HIL and an HTL, serving as the common layer 172a, may be formed on an upper surface of the pixel electrode 171, and the emission layer 172b may be formed on an upper surface of the HTL.

A hole blocking layer (Buffer) as the common layer 172a may be formed on an upper surface of the emission layer 172b, and an ETL and an EIL as the common layer 172a may be formed on an upper surface of the hole blocking layer (Buffer).

According to an exemplary embodiment, an HIL, an HTL, a hole blocking layer (Buffer), an ETL, and an EIL, which constitute the common layer 172a, may have thicknesses of about 500 Å, about 700 Å, about 200 Å, about 400 Å, and about 10 Å, respectively.

According to an exemplary embodiment, the common layer 172a including an HIL, an HTL, a hole blocking layer (Buffer), an ETL, and an DL may have a thickness of about 1810 Å.

The HIL may be formed of a phthalocyanine compound such as copper phthalocyanine, TCTA, m-MTDATA, and m-MTDAPB which is a star-bust type amine.

The HTL may be formed of N,N'-bis(3-methylphenyl)-N,N'-diphenyl-[1,1-biphenyl]-4,4'-diamine (TPD), N,N'-di(naphthalene-1-yl)-N,N'-diphenyl benzidine (α-NPD), and the like.

The EIL may be formed of a material such as LiF, NaCl, CSF, Li$_2$O, BaO, or Liq.

The ETL may be formed of Alq3.

The emission layer 172b may include a host material and a dopant material. Examples of the host material of the emission layer 172b may include tris(8-hydroxy-quinolinato)aluminum (Alq3), 9,10-di(naphth-2-yl)anthracene (AND), 3-tert-butyl-9,10-di(naphth-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), tert(9,9-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TDPVBi), 1,3-bis(carbazol-9-yl)benzene (mCP), 1,3,5-tris(carbazol-9-yl)benzene (tCP), 4,4',4"-tris(carbazol-9-yl) triphenylamine (TcTa), 4,4'-bis(carbazol-9-yl)biphenyl (CBP), 4,4'-bis(9-carbazolyl)-2,2'-dimethyl-biphenyl (CBDP), 4,4'-bis(carbazol-9-yl)-9,9-dimethyl-fluorene (DMFL-CBP), 4,4'-bis(carbazol-9-yl)-9,9-bis(9-phenyl-9H-carbazol)fluorene (FL-4CBP), 4,4'-bis(carbazol-9-yl)-9,9-di-tolyl-fluorene (DPFL-CBP), 9,9-bis(9-phenyl-9H-carbazol)fluorene (FL-2CBP), and the like.

Examples of the dopant material of the emission layer 172b may include 4,4'-bis[4-(di-p-tolylamino)styryl]biphenyl (DPAVBi), 9,10-di(naph-2-tyl)anthracene (ADN), 3-tert-butyl-9,10-di(naph-2-tyl)anthracene (TBADN), and the like.

The emission layer 172b may include a red emission layer, a green emission layer, and a blue emission layer in regions corresponding to red, green, and blue sub-pixel regions, respectively, and the red, green, and blue emission layers may have different thicknesses.

The red emission layer of the emission layer 172b includes a host material including carbazole biphenyl (CBP) or mCP(1,3-Bis(N-carbazolyl)benzene) and may be formed of a phosphorescent material including a dopant including at least one selected from PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium) and PtOEP(octaethylporphyrin platinum) or may be formed of a fluorescent material including PBD:Eu (DBM)3(Phen) or Perylene, but the present invention is not limited thereto.

The green emission layer of the emission layer 172b includes a host material including CBP or mCP and may be formed of a phosphorescent material including a dopant material including Ir(ppy)3(fac tris 2-phenylpyridine) iridium) or may be formed of a fluorescent material including Alq3(tris(8-hydroxyquinolino)aluminum), but the present invention is not limited thereto.

The blue emission layer of the emission layer 172b includes a host material including CBP or mCP, and may be formed of a phosphorescent material including a dopant material including (4,6-F2ppy)2Irpic or may be formed of a fluorescent material including at least one of spiro-DPVBi, spiro-6P, distill benzene (DSB) distyrylarylene (DSA), PFO-based polymer, and PPV-based polymer, but the present invention is not limited thereto.

According to an exemplary embodiment, the emission layer 172b may have a thickness of 200 Å or 400 Å.

According to an exemplary embodiment, the green emission layer and the blue emission layer may each have a thickness of 200 Å, and the red emission layer may have a thickness of 400 Å which is greater than the thickness of each of the green emission layer and the blue emission layer.

The organic light-emitting display apparatus 20 according to an exemplary embodiment may further include a pixel-defining layer 140 formed on an edge region of the pixel electrode 171. The pixel-defining layer 140 may define a pixel region and a non-pixel region.

The organic light-emitting display apparatus 20 according to an exemplary embodiment may form the pixel electrode 171 and the pixel-defining layer 140 using a single mask process in which a halftone mask may be used; for example.

According to an exemplary embodiment, the pixel-defining layer 140 may include a photosensitive organic layer of which shape changes in a thermal reflow process. In a thermal reflow process, the pixel-defining layer 140 is heated to melt and flow to peripheral portions thereof. Thus, when the pixel-defining layer 140 contains a large amount of solvent, the pixel-defining layer 140 is increased in flowability when being heated, and thus thermal reflow occurs.

According to an exemplary embodiment, the pixel-defining layer 140 may include an olefin-based organic layer, an acryl-based organic layer; or an imide-based organic layer. The degree of thermal reflow that occurs may be controlled by increasing or decreasing the content of solvent.

Accordingly, the pixel-defining layer 140 is not formed via an existing typical photolithography, but the pixel-defining layer 140 is formed together with the pixel electrode 171 using a thermal reflow process.

For example, this formation of the pixel-defining layer 140 and the pixel electrode 171 corresponds to a method of simultaneously patterning the pixel-defining layer 140 and the pixel electrode 171. Thus, the pixel electrode 171 and the pixel-defining layer 140 may be formed using one mask use. For example, the pixel electrode 171 and the pixel-defining layer 140 may be formed using a same mask.

According to an exemplary embodiment, the pixel electrode 171 and the pixel-defining layer 140 may be formed using a halftone mask.

The pixel-defining layer 140 may be formed on the edge region of the pixel, electrode 171.

According to an exemplary embodiment, the pixel-defining layer 140 may include a protrusion 1401 formed by a portion of the pixel-defining layer 140 protruding toward the outside of the edge of the pixel electrode 171.

As the pixel-defining layer 140 is not formed only on the pixel electrode 171 but the protrusion 1401 of the pixel-defining layer 140 is formed outside the pixel electrode 171, the via insulating layer 109 formed below the pixel electrode 171 may be spaced apart from the protrusion 1401 and thus form an empty space may be formed therebetween.

For example, a cavity 190 may be formed between the via insulating layer 109 and the protrusion 1401 due to the formation of the protrusion 1401 outside the pixel electrode 171.

According to an exemplary embodiment, a thickness of the space formed between the via insulating layer 109 and the protrusion 1401, for example, a thickness of each of the pixel electrode 171 and the cavity 190, may be about 1140 Å.

Accordingly, when the intermediate layer 172 is formed between the two pixel-defining layers 140 formed on both ends of the pixel electrode 171 and the opposite electrode 173 is formed on the intermediate layer 172 using a deposition process, the cavity 190 may prevent the opposite electrode 173 from being short-circuited with the pixel electrode 171.

In the organic light-emitting display apparatus 20 according to an exemplary embodiment, the common layer 172a included in the intermediate layer 172 may be formed to cover the protrusion 1401. In an exemplary embodiment, the common layer 172a may be formed on the entire surface of the substrate, covering the protrusion 1401.

For example, the common layer 172a may be formed thicker than the cavity 190, and the common layer 172a may cover not only the protrusion 1401 but also the cavity 190. At this time, a portion of the common layer 172a may form a first protection layer 160 that surrounds the edge of the pixel electrode 171. In an exemplary embodiment, after the first protection layer 160 is formed separately from the common layer 172a, the first protection layer 160 may be covered by the common layer 172a However, a case where a portion of the common layer 172a forms the first protection layer 160 will now be described for convenience of explanation. The first protection layer 160 may contact the pixel electrode 171, and, as illustrated in FIG. 4, the cavity 190 may be formed and thus the first protection layer 160 need not contact the pixel electrode 171.

According to an exemplary embodiment, the cavity 190 may have a thickness of about 1140 Å, and the common layer 172a may have a thickness of about 1810 Å, which is greater than the thickness of the cavity 190.

According to an exemplary embodiment, the common layer 172a covers the cavity 190 and thus may planarize the protrusion 1401 and the cavity 190 located outside the pixel electrode 171.

Accordingly, the opposite electrode 173 formed on an upper surface of the intermediate layer 172 is not affected by the protrusion 1401 and the cavity 190 and a step coverage of the opposite electrode 173 is increased by the intermediate layer 172.

For example, since the intermediate layer 172 outside the pixel electrode 171 is formed to cover and planarize both the protrusion 1401 and the cavity 190, the opposite electrode 173 may be prevented from being short-circuited by the protrusion 1401 and the cavity 190.

Figure 5:
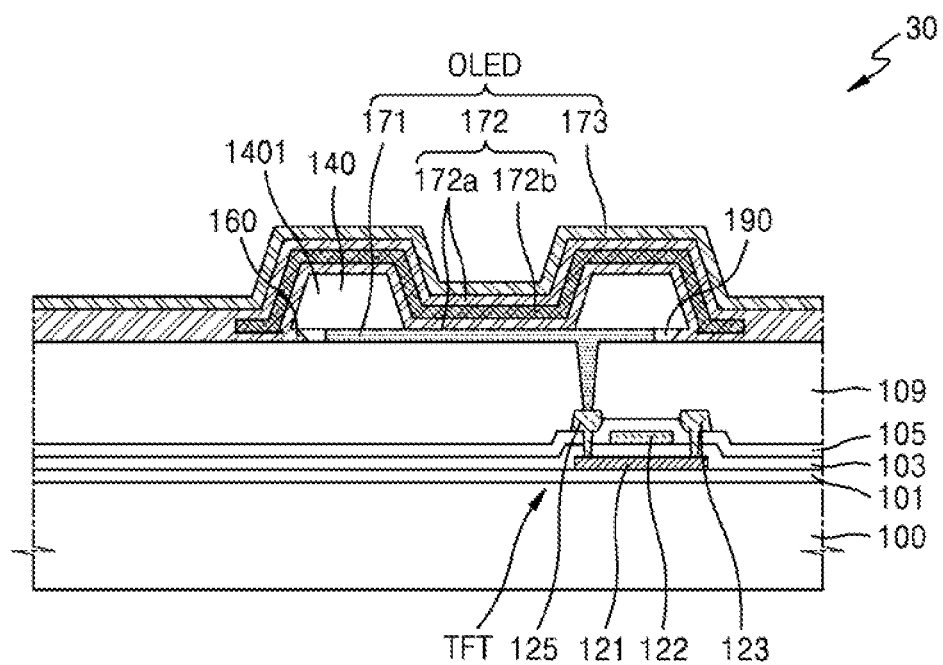

Referring to FIG. 5, an organic light-emitting display apparatus 30 according to an exemplary embodiment may form the pixel electrode 171 and the pixel-defining layer 140 by using a halftone mask according to a single mask process.

During this process, the protrusion 1401 may be formed by a portion of the pixel-defining layer 140 protruding toward the outside of the edge of the pixel electrode 171.

The via insulating layer 109 formed below the pixel electrode 171, and the protrusion 1401 are spaced apart from each other and thus an empty space may be formed therebetween. For example, a cavity 190 located below the protrusion 1401 may be formed around the pixel electrode 171.

When the opposite electrode 173 is stacked on the protrusion 1401 and the cavity 190 in this state, the opposite electrode 173 may be short-circuited by the protrusion 1401 and the cavity 190, and thus the protrusion 1401 and the cavity 190 need to be covered and planarized.

In the organic light-emitting display apparatus 30 according to an exemplary embodiment, the emission layer 172b and the common layer 172a, which constitute the intermediate layer 172, may be formed to cover the protrusion 1401 and the cavity 190.

According to an exemplary embodiment, the common layer 172a may be formed on the entire surface of the substrate 100, the common layer 172a including at least one of an HIL, an HTL, a hole blocking layer (Buffer), an ETL, and an EIL.

Moreover, the emission layer 172b may extend to the outside of the pixel-defining layer 140. For example, referring to FIG. 3, the emission layer 172b may cover the entire portion of the protrusion 1401 of the pixel-defining layer 140.

According to an exemplary embodiment, the emission layer 172b may extend to cover the entire portion of the protrusion 1401 of the pixel-defining layer 140 and to cover the cavity 190 formed between the protrusion 1401 and the via insulating layer 109.

In this case, since the intermediate layer 172 covering the protrusion 1401 and the cavity 190 includes not only the common layer 172a but also the emission layer 172b, the thickness of the intermediate layer 172 covering the protrusion 1401 and the cavity 190 may increase. In addition, the first protection layer 160 may include a portion of the common layer 172a and a portion of the emission layer 172b.

According to an exemplary embodiment, the common layer 172a may have a thickness of about 1810 Å, and the emission layer 172b may have a thickness of about 200 Å or 400 Å.

Accordingly, as the thickness of the intermediate layer 172 covering the protrusion 1401 and the cavity 190 increases, the intermediate layer 172 may more securely cover the cavity 190, and a short-circuit of the opposite electrode 173 formed on the intermediate layer 172 may be prevented.

According to an exemplary embodiment, only one among the red emission layer, the blue emission layer, and the green emission layer included in the emission layer 172b may extend to cover the entire portion of the protrusion 1401 of the pixel-defining layer 140 and to cover the cavity 190 formed between the protrusion 1401 and the via insulating layer 109.

According to an exemplary embodiment, when the red emission layer of the emission layer 172b extends to the cavity 190, the emission layer 172b and the common layer 172a may have thicknesses of about 400 Å and about 1810 Å, respectively, and thus the intermediate layer 172 covering the cavity 190 may have a thickness of about 2210 Å, which is a sum of the thicknesses of about 400 Å and about 1810 Å.

According to an exemplary embodiment, when the green or blue emission layer of the emission layer 172b extends to the cavity 190, the emission layer 172b and the common layer 172a may have thicknesses of about 200 Å and about 1810 Å, respectively, and thus the intermediate layer 172 covering the cavity 190 may have a thickness of about 2010 Å, which is a sum of the thicknesses of about 200 Å and about 1810 Å.

Accordingly, when the emission layer 172b and the common layer 172a extend to cover the cavity 190 via deposition, the thickness of the intermediate layer 172 is about 2010 Å or about 2210 Å, which is much greater than about 1140 Å, which is the thickness of the cavity 190, and thus the intermediate layer 172 covers the entire portion of the cavity 190 to thereby preventing short-circuit of the opposite electrode 173 with the pixel electrode 171.

According to an exemplary embodiment, at least two among the red emission layer, the blue emission layer, and the green emission layer included in the emission layer 172b may extend to cover the entire portion of the protrusion 1401 of the pixel-defining layer 140 and to cover the cavity 190 formed between the protrusion 1401 and the via insulating layer 109.

According to an exemplary embodiment, at least two of the emission layers 172b extending to cover the cavity 190 from adjacent pixels may overlap with each other in the cavity 190.

In this case, as a thickness of the intermediate layer 172 covering the cavity 190 increases, the intermediate layer 172 may more securely cover the cavity 190, and thus short-circuit of the opposite electrode 173 with the pixel electrode 171 may be prevented.

Figure 6:
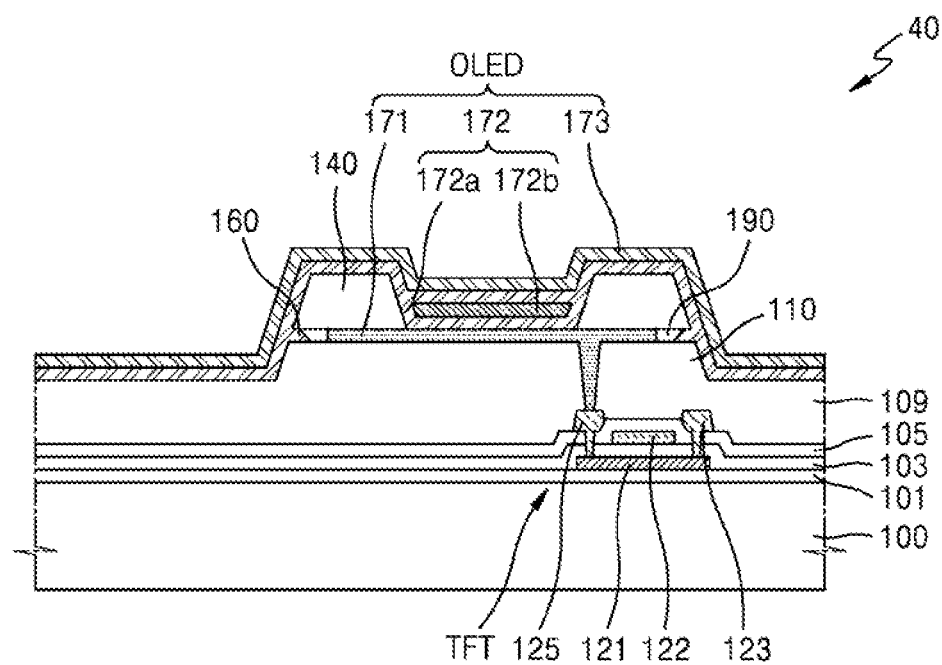

Referring to FIG. 6, an organic light-emitting display apparatus 40 according to an exemplary embodiment may form a pixel electrode 171 and a pixel-defining layer 140 by using a halftone mask according to a single mask process.

The pixel electrode 171 may be formed on an upper surface of the via insulating layer 109, and may be connected to the drain electrode 125 through a via hole.

The pixel-defining layer 140 may be formed via wet etching or dry etching. In wet etching, etching is performed using a solution. In dry etching, etching is performed using an ionized gas or the like.

When the pixel-defining layer 140 is formed via dry etching, the via insulating layer 109 below the pixel-defining layer 140 may be also etched.

According to an exemplary embodiment, the via insulating layer 109 may be formed of at least one selected from the group consisting of polyacrylate resin, epoxy resin, phenolic resin, polyimide resin, polyimide resin, unsaturated polyester resin, poly phenylenether resin, polyphenylenesulfide resin, and benzocyclobutene (BCB).

The pixel-defining layer 140 according to an exemplary embodiment may include a photosensitive organic layer, namely, an olefin-based organic layer, an acryl-based organic layer, or an imide-based organic layer.

Accordingly, while the photosensitive organic layer that forms the pixel-defining layer 140 is dry-etched, the via insulating layer 109 below the pixel-defining layer 140 may be also etched.

Referring to FIG. 6, a region of the via insulating layer 109 other than a region on which the pixel-defining layer 140 and the pixel electrode 171 are formed may be removed.

For example, a step difference occurs in a portion of the via insulating layer 109 corresponding to an outside region around the pixel-defining layer 140 so as to be adjacent to the region of the via insulating layer 109 on which the protrusion 1401 of the pixel-defining layer 140 is formed, and thus a via step 110 may be formed.

In the organic light-emitting display apparatus 40 according to an exemplary embodiment, the protrusion 1401 may be formed by a portion of the pixel-defining layer 140 protruding toward the outside of the edge of the pixel electrode 171.

Because the protrusion 1401 is spaced apart from the via step 110 by a predetermined distance, the cavity 190 may be formed around the pixel electrode 171.

The intermediate layer 172 may be formed on the upper surfaces of the pixel electrode 171 and the pixel-defining layer 140.

According to an exemplary embodiment, the common layer 172a included in the intermediate layer 172 may be formed to cover the entire surface of the pixel-defining layer 140 and to cover both the protrusion 1401 and the via step 110.

At this time, the common layer 172a may be formed to be thicker than the cavity 190 between the protrusion 1401 and the via step 110, and thus the common layer 172a may be formed to cover the cavity 190 and thus may planarize the protrusion 1401, the cavity 190, and the via step 110.

Consequently, as the opposite electrode 173 is formed over the protrusion 1401, the cavity 190, and the via step 110 planarized by the common layer 172a, short-circuit of the opposite electrode 173 may be prevented.

According to an exemplary embodiment, the via step 110 and the protrusion 1401 may be formed such that an angle at which the via step 110 is inclined with respect to the ground is less than an angle at which the via step 110 is inclined with respect to the ground.

According to an exemplary embodiment, a tapered angle of the via step 110 formed below the cavity 190 may be a tapered angle of the protrusion 1401 formed over the cavity 190. For example, an upper end of the via step 110 may be vertically at least aligned with a lower end of the protrusion 1401 or may be formed more inside than the lower end of the protrusion 1401.

Accordingly, when the common layer 172a is formed, the common layer 172a may cover the protrusion 1401 and may easily cover both the cavity 190 and the via step 110 formed below the protrusion 1401.

Figure 7:
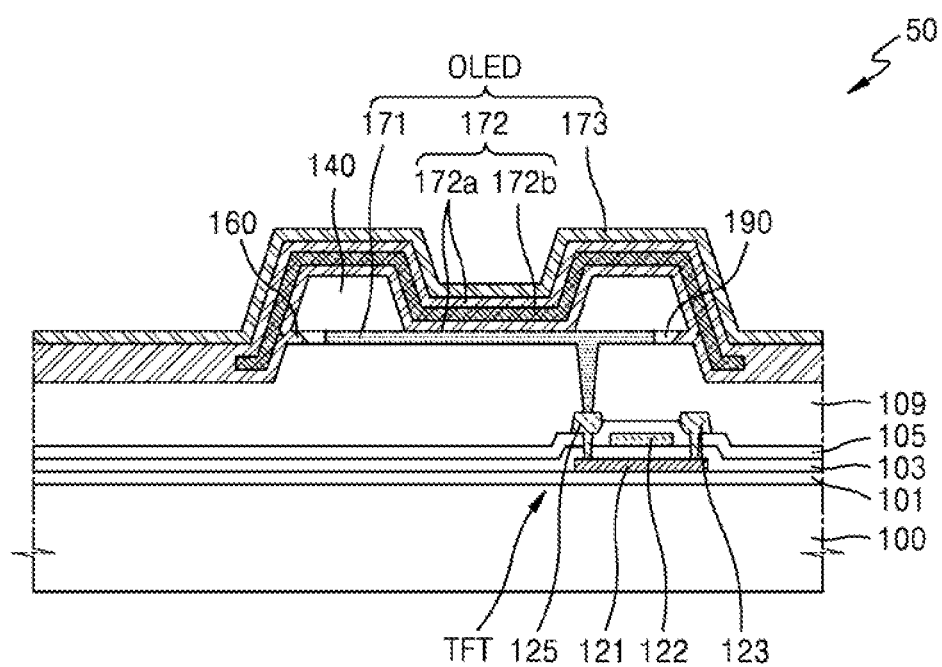

Referring to FIG. 7, an organic light-emitting display apparatus 50 according to an exemplary embodiment may form a pixel electrode 171 and a pixel-defining layer 140 by using a halftone mask according to a single mask process.

According to an exemplary embodiment, the pixel-defining layer 140 may be formed via dry etching, and, at this time, the via insulating layer 109 below the pixel-defining layer 140 may also be etched.

According to an exemplary embodiment, the via insulating layer 109 may be formed of at least one selected from the group consisting of polyacrylate resin, epoxy resin, phenolic resin, polyamide resin, polyimide resin, unsaturated polyester resin, poly phenylenether resin, poly phenylenesulfide resin, and benzocyclobutene (BCB), and the pixel-defining layer 140 may include a photosensitive organic layer, namely, an olefin-based organic layer, an acryl-based organic layer, or an imide-based organic layer.

Accordingly, when dry etching is performed to form the pixel-defining layer 140, a region of the via insulating layer 109 other than a region on which the pixel-defining layer 140 and the pixel electrode 171 are formed may be removed.

For example, referring to FIG. 7, a step difference may occur in a portion of the via insulating layer 109 corresponding to an outside region around the pixel-defining layer 140 that is adjacent to the region of the via insulating layer 109 on which the protrusion 1401 of the pixel-defining layer 140 is formed, and thus a via step 110 may be formed.

In the organic light-emitting display apparatus 50 according to an exemplary embodiment, the protrusion 1401 may be formed by a portion of the pixel-defining layer 140 protruding toward the outside of the edge of the pixel electrode 171. Because the protrusion 1401 is spaced apart from the via step 110 by a predetermined distance, the cavity 190 may be formed around the pixel electrode 171.

The intermediate layer 172 may be formed on the upper surfaces of the pixel electrode 171 and the pixel-defining layer 140.

According to an exemplary embodiment, the common layer 172a included in the intermediate layer 172 may be formed to cover the entire surface of the pixel-defining layer 140 and to cover both the protrusion 1401 and the via step 110.

At this time, in the organic light-emitting display apparatus 50 according to an exemplary embodiment, the emission layer 172b, included in the intermediate layer 172, together with the common layer 172a may extend such as to cover the entire surface of the pixel-defining layer 140.

For example, the emission layer 172b together with the common layer 172a may extend to the via step 110 in order to cover the entire surface of the pixel-defiling layer 140 and to cover the protrusion 1401 and the cavity 190.

According to an exemplary embodiment, the common layer 172a may have a thickness of about 1810 Å, and the emission layer 172b may have a thickness of about 200 Å or 400 Å, Accordingly, as the intermediate layer 172 covering the protrusion 1401 and the cavity 190 becomes thicker, the intermediate layer 172 may more securely cover the cavity 190, and a short-circuit of the opposite electrode 173 formed on the intermediate layer 172 may be prevented.

According to an exemplary embodiment, only one among the red emission layer, the blue emission layer, and the green emission layer included in the emission layer 172b may extend to the via step 110 in order to cover the entire portion of the protrusion 1401 of the pixel-defining layer 140 and to cover the protrusion 1401 and the cavity 190.

According to an exemplary embodiment, when the red emission layer of the emission layer 172b extends to the cavity 190 and the via step 110, the emission layer 172b and the common layer 172a may have thicknesses of about 400 Å and about 1810 Å, respectively, and thus the intermediate layer 172 covering the cavity 190 may have a thickness of about 2210 Å, which is a sum of the thicknesses of about 400 Å and about 1810 Å.

According to an exemplary embodiment, when the green or blue emission layer of the emission layer 172b extends to the cavity 190 and the via step 110, the emission layer 172b and the common layer 172a may have thicknesses of about 200 Å and about 1810 Å, respectively, and thus the intermediate layer 172 covering the cavity 190 may have a thickness of about 2010 Å, which is a sum of the thicknesses of about 200 Å and about 1810 Å.

Accordingly, when the emission layer 172b and the common layer 172a extend to cover the protrusion 1401, the cavity 190, and the via step 110 using a deposition process, the thickness of the intermediate layer 172 covering the protrusion 1401 and the cavity 190 is about 2010 Å or about 2210 Å, which is greater than about 1140 Å, which is the thickness of the cavity 190, and thus the intermediate layer 172 covers the entire portion of the cavity 190 to prevent short-circuit of the opposite electrode 173.

According to an exemplary embodiment, at least two among the red emission layer, the blue emission layer, and the green emission layer included in the emission layer 172b may extend to the via step 110 to cover the entire portion of the protrusion 1401 of the pixel-defining layer 140 and to cover the protrusion 1401 and the cavity 190.

According to an exemplary embodiment, at least two emission layers 172b extending to cover the cavity 190 and the via step 110 from adjacent pixels may overlap with each other in the cavity 190.

In this case, the intermediate layer 172 covering the cavity 190 may become thicker, and the intermediate layer 172 may securely cover the cavity 190, and thus short-circuit of the opposite electrode 173 may be prevented.

A method of manufacturing an organic light-emitting display apparatus according to an exemplary embodiment of the present invention will now be described with reference to FIGS. 8A-9.

Figure 8A:
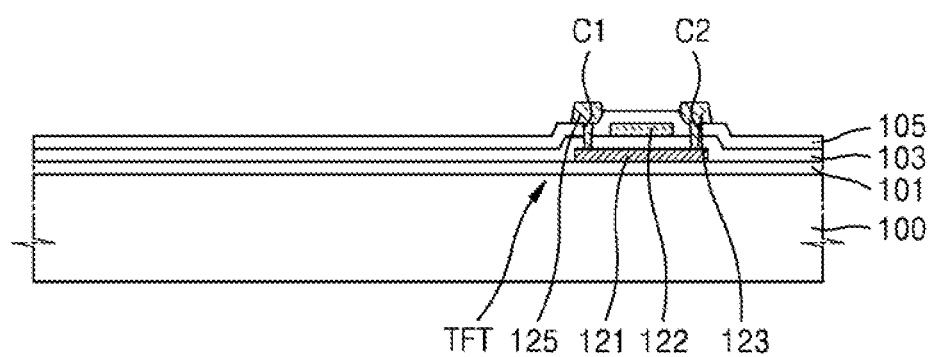
FIGS. 8A-8H and 9 are cross-sectional views for describing a method of manufacturing the organic light-emitting display apparatus of FIG. 2.
Figure 8B:
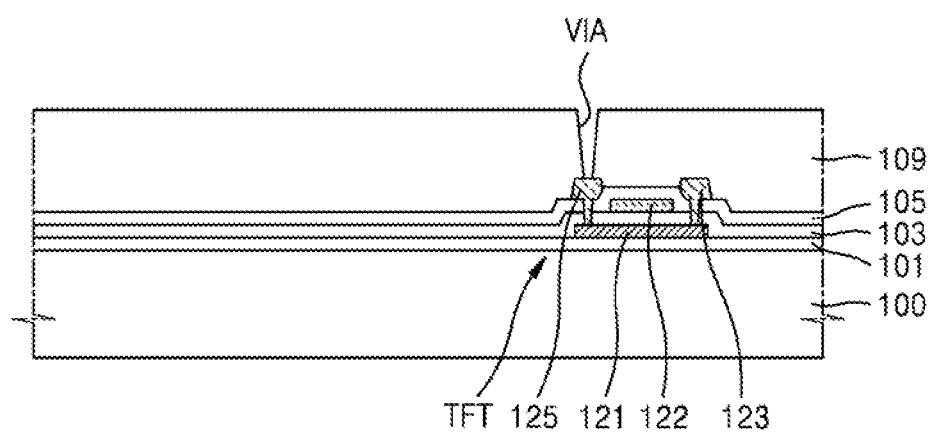
Figure 8C:
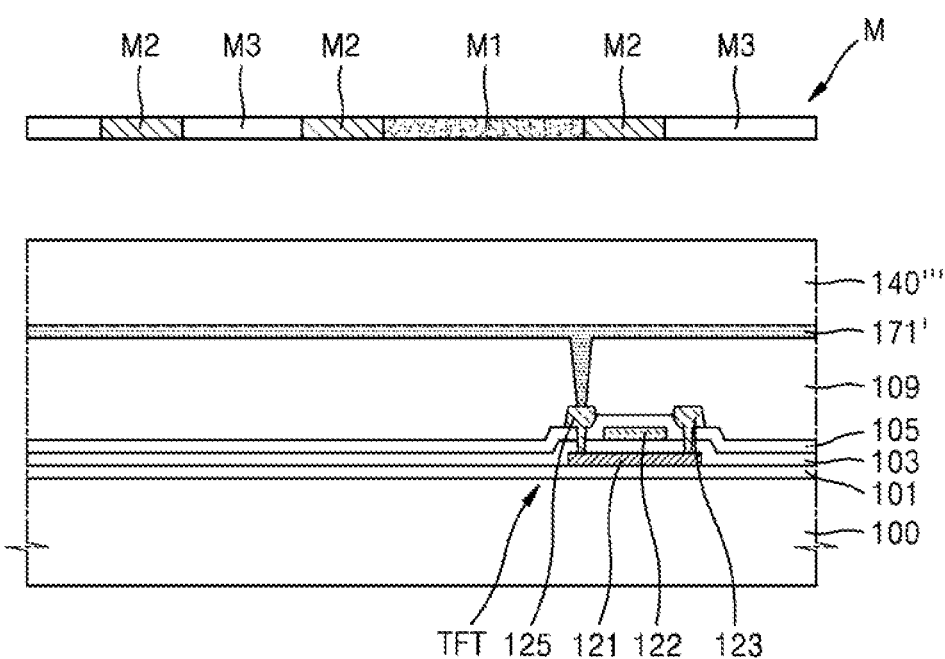
Figure 8D:
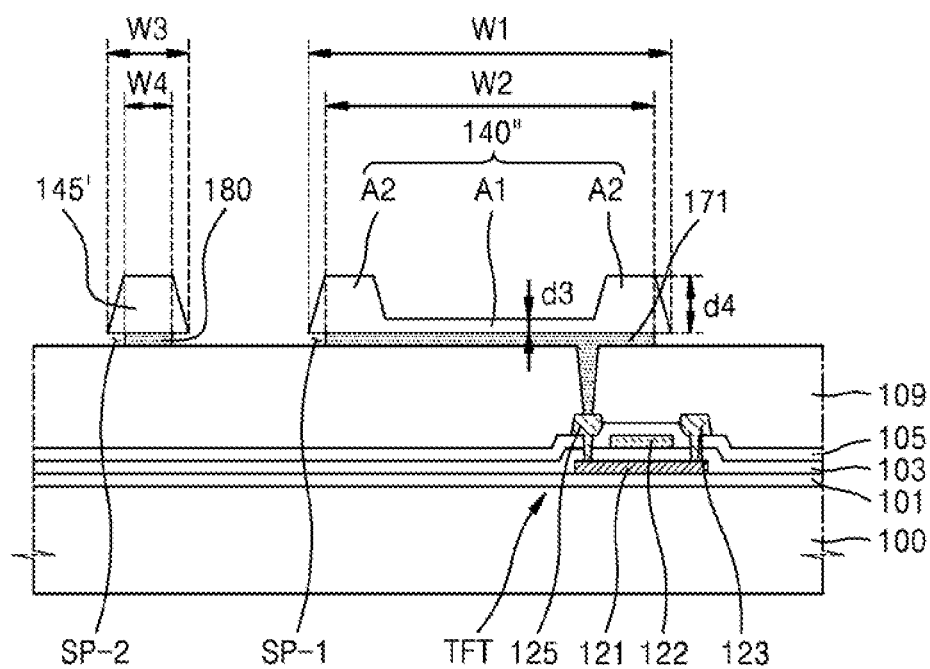
Figure 8E:
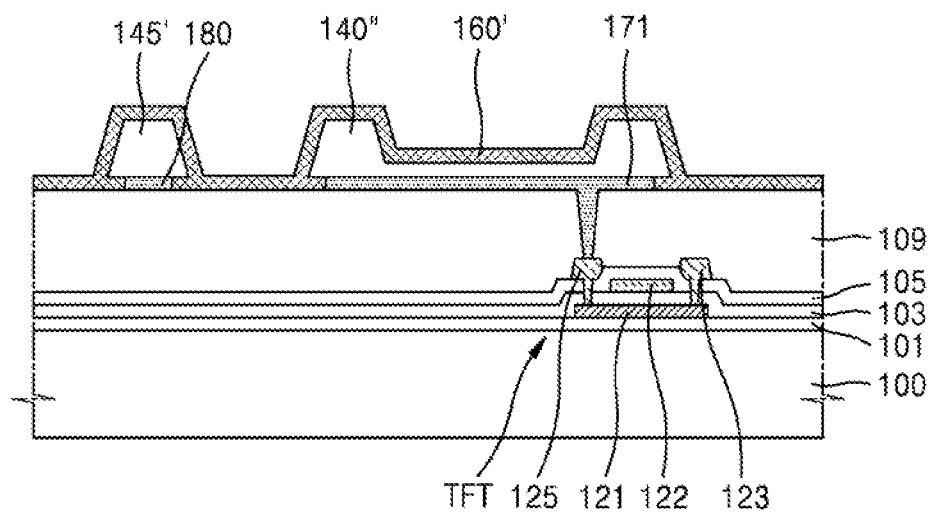
Figure 8F:
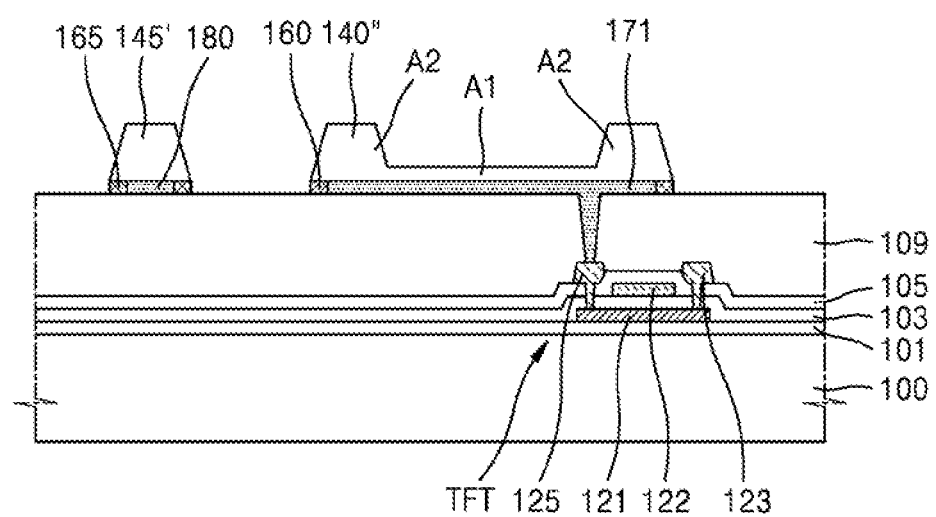
Figure 8G:
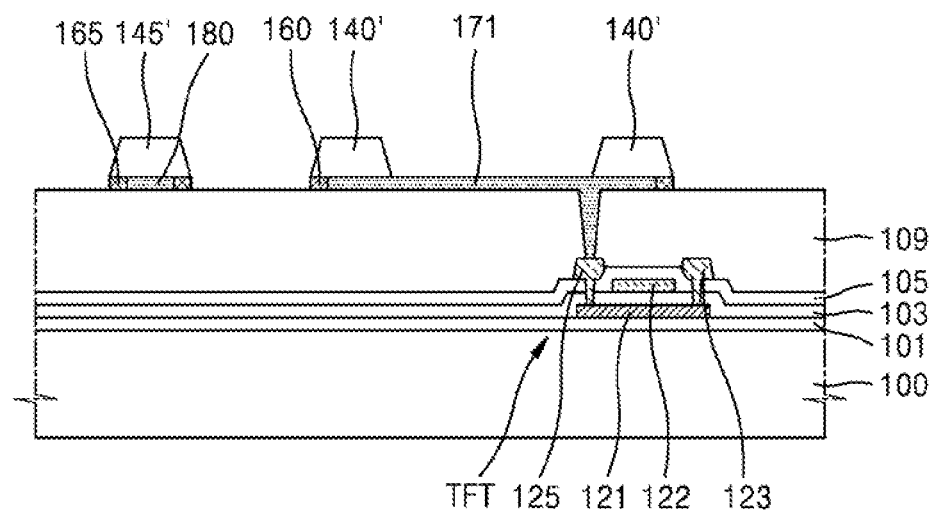
Figure 8H:
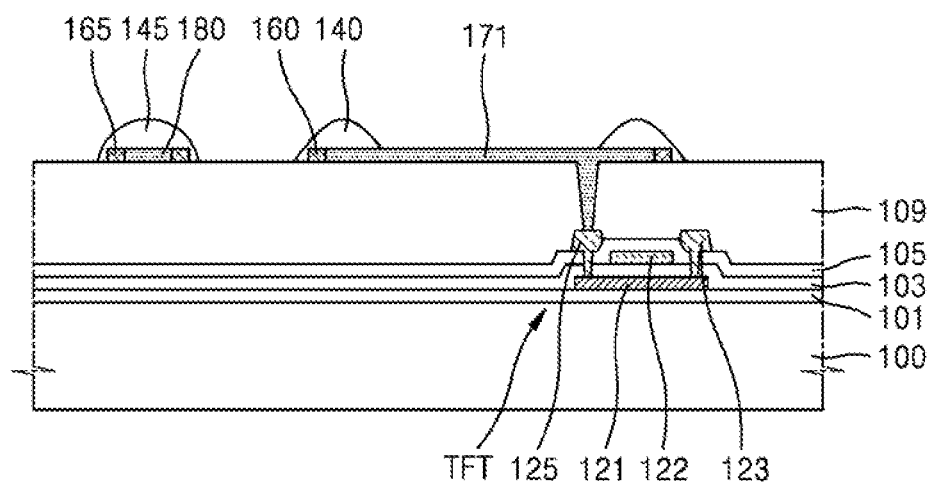
Figure 9:
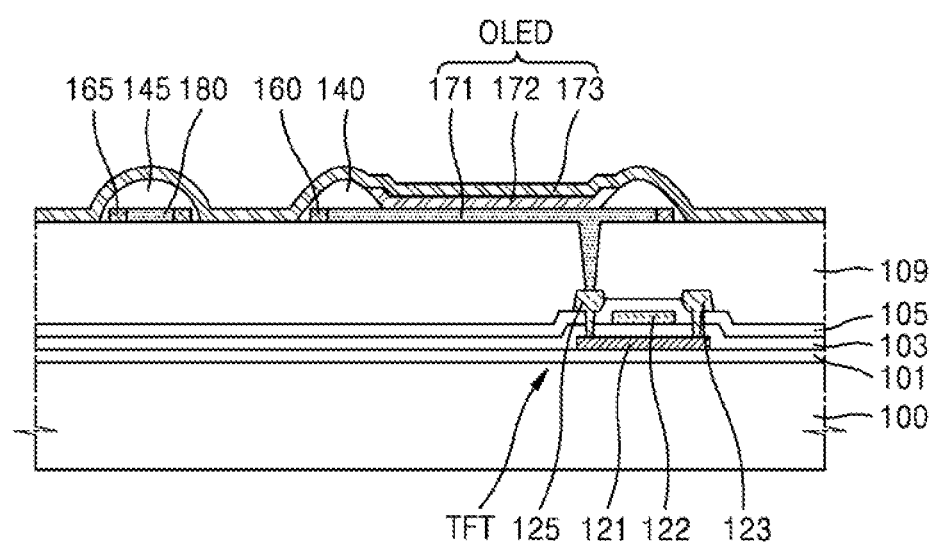

FIGS. 8A-9 are cross-sectional views for describing a method of manufacturing the organic light-emitting display apparatus 10 of FIG. 2.

Referring to FIG. 8A, the thin film transistor TFT may be formed on the substrate 100 including the display area DA of FIG. 1, on which an image is displayed, and the non-display area NDA of FIG. 1 around the display area DA.

For example, a buffer layer 101 may be formed on the substrate 100, and then a semiconductor material layer may be patterned on the buffer layer 101 to thereby form the active layer 121. Thereafter, the gate insulating layer 103 may be formed on the active layer 121, and then a conductive material may be patterned on the gate insulating layer 103 to thereby form the gate electrode 122. The gate electrode 122 may overlap at least a portion of the active layer 121.

After the gate electrode 122 is formed, an interlayer insulating layer 105 may be formed to cover the gate electrode 122, and the interlayer insulating layer 105 and the gate insulating layer 103 may be simultaneously etched to thereby form at least two contact holes C1 and C2 through which the active layer 121 is exposed.

According to an exemplary embodiment, the active layer 121 may include poly crystalline silicon, and the regions of the active layer 121 exposed via the contact holes C1 and C2 may be the source region and the drain region of the active layer 121. The source region and the drain region may be doped polycrystalline silicon regions, for example, conductor regions. According to an exemplary embodiment, doping may be performed after the gate electrode 122 is formed.

The buffer layer 101, the gate insulating layer 103, and the interlayer insulating layer 105 may extend from the display region DA to the non-display region NDA, and may be removed such that an edge region of the substrate 100 located in the non-display region NDA is exposed. The removal of the buffer layer 101, the gate insulating layer 103, and the interlayer insulating layer 105 to expose a portion of the substrate 100 located in the non-display region NDA may be performed simultaneously with the process of forming the contact holes C1 and C2.

After the contact holes C1 and C2 are formed, a conductive material may be deposited on the interlayer insulating layer 105 and then patterned to thereby form the source electrode 123 and the drain electrode 125 that are respectively connected to the source region and the drain region of the active layer 121.

Referring to FIG. 8B, a first insulating material may be deposited on the substrate 100 to cover the thin film transistor TFT and then may be patterned to thereby form the via insulating layer 109 disposed within the display area DA. The via insulating layer 109 may be a single layer or multiple layers formed of an organic material, and may include a via hole VIA.

Referring to FIG. 8C, a conductive material layer 171' and a second insulating material layer 140''' may be formed on the via insulating layer 109. The conductive material layer 171' may include a transparent conductive oxide. For example, the transparent conductive oxide may include indium tin oxide (ITO), indium zinc oxide (IZO), zinc oxide (ZnO), indium oxide ($In_2O_3$), indium gallium oxide (IGO), or aluminum zinc oxide (AZO). The present invention is not limited thereto. For example, the conductive material layer 171' may include a metal reflective layer, such as silver (Ag), magnesium (Mg), aluminum (Al), platinum (Pt), palladium (Pd), gold (Au), nickel (Ni), neodymium (Nd), iridium (Ir), or chrome (Cr). The second insulating material layer 140''' may include a photosensitive organic material, such as polyimide.

Light may be radiated to the second insulating material layer 140''' by using a photomask M. The photomask M may be a halftone mask or a slit mask. According to an exemplary embodiment, when the photomask M is a halftone mask, the halftone mask M may include a light-transmissive portion M3, a light-reflective portion M2, and a semi-light-transmissive portion M1. The light-transmissive portion M3 may correspond to a region from which the conductive material layer 171 is to be completely removed, the light-reflective portion M2 may correspond to a region where the second insulating material layer 140''' finally remains, and the semi-light-transmissive portion M1 may correspond to a region in which the second insulating material layer 140''' partially remains and then is removed using an asking process. According to an exemplary embodiment, when the photomask M is a slit mask, the slit mask M may include a slit portion M1 including at least one slit bar that blocks light, a light-transmissive portion M3 that transmits light, and a light-reflective portion M2 that blocks light.

Referring to FIG. 8D, after the second insulating material layer 140''' irradiated with light via the light-transmissive portion M3 is completely removed and the second insulating material layer 140''' irradiated with light via the semi-light-transmissive portion M3 is partially removed, a first photosensitive pattern layer 140'' including a first region A1 and a second region A2 surrounding the first region A1 may be formed. A thickness d3 of the first region A1 may be less than a thickness d4 of the second region A2, and the second region A2 may substantially correspond to the edge region of the pixel electrode 171. Using the same process as described above, a third photosensitive pattern layer 145' spaced apart from the first photosensitive pattern layer 140'' may also be formed.

Thereafter by using the first photosensitive pattern layer 140'' and the third photosensitive pattern layer 145' as a mask, the conductive material layer 171' may be etched, and thus the pixel electrode 171 and the line 180 may be formed. At this time, an exposed region of the conductive material layer 171' through the third photosensitive pattern layer 145' and the first photosensitive pattern layer 140'' is etched so that a width W2 of the pixel electrode 171 is less than a width W1 of the first photosensitive pattern layer 140''. In this case, the exposed region of the conductive material layer 171' may be completely removed and after the exposed region of the conductive material layer 171' is removed, the conductive material layer 171' may be further etched, i.e. over-etched so that an edge of the pixel electrode 171 may be more inside than an edge of the first photosensitive pattern layer 140''. For example, the edge of the pixel electrode 171 may be disposed under the first photosensitive pattern layer 140''. Similarly, a width W4 of the line 180 is less than a width W3 of the third photosensitive pattern layer 145', and an edge of the line 180 may be more inside than an edge of the third photosensitive pattern layer 145'. For example, the edge of the line 180 may be disposed under the third photosensitive pattern layer 145'.

After the conductive material layer 171' is etched as described above, a first space SP-1 may be defined by the pixel electrode 171, the first photosensitive pattern layer 140'' and the via insulating layer 109. A second space may be defined by the line 180, the third photosensitive pattern layer 145' and the via insulating layer 109. The first space SP-1 and the second space SP-2 may be referred to as an over-etched portions.

Referring to FIG. 8E, a protecting material layer 160' may be formed to cover the first photosensitive pattern layer 140'' and the via insulating layer 109. According to an exemplary embodiment, the protecting material layer 160' may include an inorganic insulating material, for example, silicon nitride (SiNx) or silicon oxynitride (SiON). According to an exemplary embodiment, the protecting material layer 160' may include an organic insulating material, for example, polyimide or siloxane. Due to a capillary phenomenon, the protecting material layer 160' may be formed on upper surfaces of the first photosensitive pattern layer 140'', the third photosensitive pattern layer 145', The via insulating layer 109 may also be formed within the over-etched portions of the pixel electrode 171 and the line 180.

Referring to FIG. 8F, an exposed portion of the protecting material layer 160', except for portions of the protecting material layer 160' formed within the over-etched portions of the pixel electrode 171 and the line 180 and located below the first photosensitive pattern layer 140'' and the third photosensitive pattern layer 145', may be etched to thereby form the first protection layer 160 and the second protection layer 165. At this time, the exposed portion of the protecting material layer 160' may be removed via a dry etching process in which the protecting material layer 160' may be anisotropically etched. Because the anisotropic etching has etch directivity, the first protection layer 160 and the second protection layer 165 disposed below the first photosensitive pattern layer 140" and the third photosensitive pattern layer 145' need not be etched.

The first protection layer 160 may be arranged along the edge of the pixel electrode 171, and may be between the edge of the pixel electrode 171 and the edge of the first photosensitive pattern layer 140". The second protection layer 165 may be arranged along the edge of the line 180, and may be between the edge of the line 180 and the edge of the third photosensitive pattern layer 145'.

Referring to FIG. 86, a portion of the first photosensitive pattern layer 140" may be removed using an ashing process. For example, a height of the first photosensitive pattern layer 140" may be lowered in the ashing process, and, at this time, a height of the third photosensitive pattern layer 145' may also be lowered. The first region A1 of the first photosensitive pattern layer 140", remaining after the light radiation using the semi-light-transmissive portion M1 of FIG. 3C, may be completely removed via the ashing process. Accordingly, a second photosensitive pattern layer 140' exposing a center region of the pixel electrode 171 may be formed. The second photosensitive pattern layer 140' may cover the upper surfaces of at least one region of the first protection layer 160 and an edge region of the pixel electrode 171.

Referring to FIG. 8H, the second photosensitive pattern layer 140' having undergone the ashing process may be heated and thus reflowed to thereby forming the pixel-defining layer 140 covering the edge region of the pixel electrode 171. The second photosensitive pattern layer 140' may flow down due to thermal reflow and thus may completely cover the upper surface of the first protection layer 160, and the second photosensitive pattern layer 140' together with the first protection layer 160 may shield the edge region of the pixel electrode 171. When the edge of the pixel electrode 171 is exposed, it may short-circuit with the opposite electrode 173 of FIG. 4 that is formed via a subsequent process. To prevent this problem, the pixel-defining layer 140 may cover the edge region of the pixel electrode 171 according to a reflow process. For example, in the method of manufacturing the organic light-emitting display apparatus 10 according to an exemplary embodiment of the present invention, since the first protection layer 160 is disposed along the edge of the pixel electrode 171, even when the pixel-defining layer 140 fails to cover the edge of the pixel electrode 171 due to a process deviation, the first protection layer 160 may shield the edge of the pixel electrode 171. Thus, the number of defective pixels generated in a subsequent process may be minimized.

According to the same process as described above, the third photosensitive pattern layer 145' may be heated and thus reflowed, thereby forming the line insulating layer 145 covering the edge of the line 180. The line insulating layer 145 may also protect the edge of the line 180 to thereby prevent exposure of the edge of the line 180 even when the line insulating layer 145 fails to completely cover the edge of the line 180.

Referring to FIGS. 1 and 9, the intermediate layer 172 may be formed on a region of the pixel electrode 171 not covered by the pixel-defining layer 140, and then the opposite electrode 173 may be formed on the intermediate layer 172, thereby forming the organic light-emitting diode OLED. The opposite electrode 173 may be formed in only the display region DA and need not be formed in the non-display region NDA. Although not shown in FIG. 9, the thin-film encapsulation layer 150 of FIG. 2 including at least one inorganic layer 152 of FIG. 2 and at least one organic layer 151 of FIG. 2 may be formed on the opposite electrode 173.

As described above, in the method of manufacturing the organic light-emitting display apparatus 10 according to an exemplary embodiment, the pixel electrode 171 and the pixel-defining layer 140 may be formed using a single mask. Thus, the organic light-emitting display apparatus 10 may be manufactured at low cost according to a simple process. Moreover, in the method of manufacturing the organic light-emitting display apparatus 10 according to an exemplary embodiment, the first protection layer 160 disposed along the edge of the pixel electrode 171 may be included, and thus may completely shield the edge of the pixel electrode 171 in spite of a process deviation, thereby preventing generation of many defective pixels.

A method of manufacturing an organic light-emitting display apparatus according to an exemplary embodiment of the present invention will now be described with reference to FIGS. 10A-100.

FIGS. 10A-10D are cross-sectional views for describing a method of manufacturing the organic light-emitting display apparatus 20 of FIG. 4. When FIGS. 10A-10D are described, because the processes previous to the process of forming the first photosensitive pattern layer 140" including the first region A1 and the second region A2 surrounding the first region A are the same as those of the manufacturing method of FIG. 8, descriptions thereof will not be repeated herein.

Figure 10A:
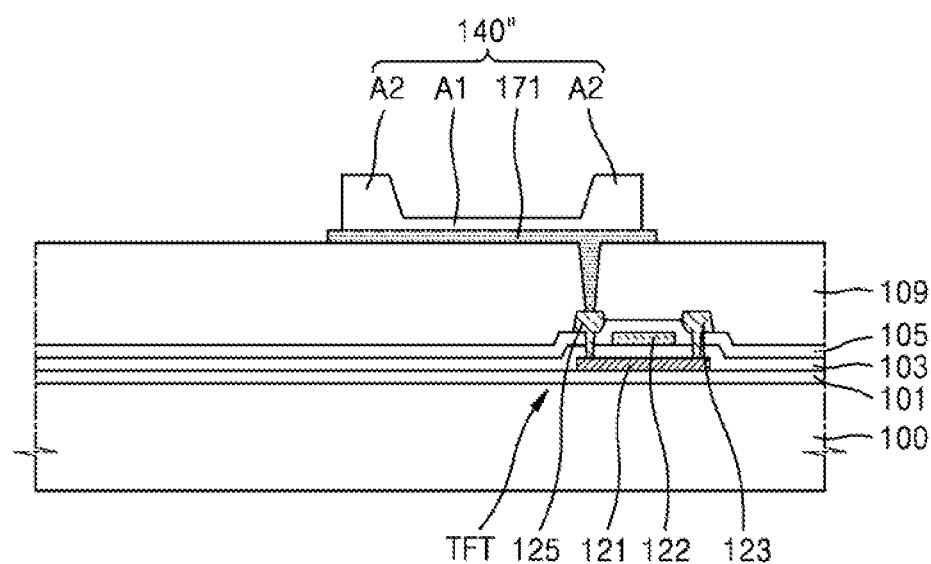
FIGS. 10A-10D are cross-sectional views for describing a method of manufacturing the organic light-emitting display apparatus of FIG. 4.

Referring to FIG. 10A, the first region A1 of the first photosensitive pattern layer 140" remains on the pixel electrode 171, and the second region A2, which is to turn into the pixel-defining layer 140, remains on the edge of the pixel electrode 171. In an exemplary embodiment, the second region A2 of the first photosensitive pattern layer 140" may be thicker than the first region A1 of the first photosensitive pattern layer 140".

Next, the first region A1 is removed so that a portion of the pixel electrode 171 is exposed. The second region A2 may be partially removed to remain on the edge region of the pixel electrode 171. The remaining second region A2 may be referred to as the pixel-defining layer 140.

At this time, a dry etching process or a wet etching process may be €sed. In a wet etching process, the etching is performed using a solution. In a dry etching, the etching is performed using an ionized gas or the like.

Whether to use a dry etching process or a wet etching process to remove the first region A1 may affect the via insulating layer 109 located below the pixel electrode 171.

In the method of manufacturing the organic light-emitting display apparatus 20 according to an exemplary embodiment, as the first region A1, which is a photosensitive organic layer, is removed via wet etching, the via insulating layer 109 below the first region A1 need not be affected, maintaining an upper surface of the via insulating layer 109 flat.

Figure 10B:
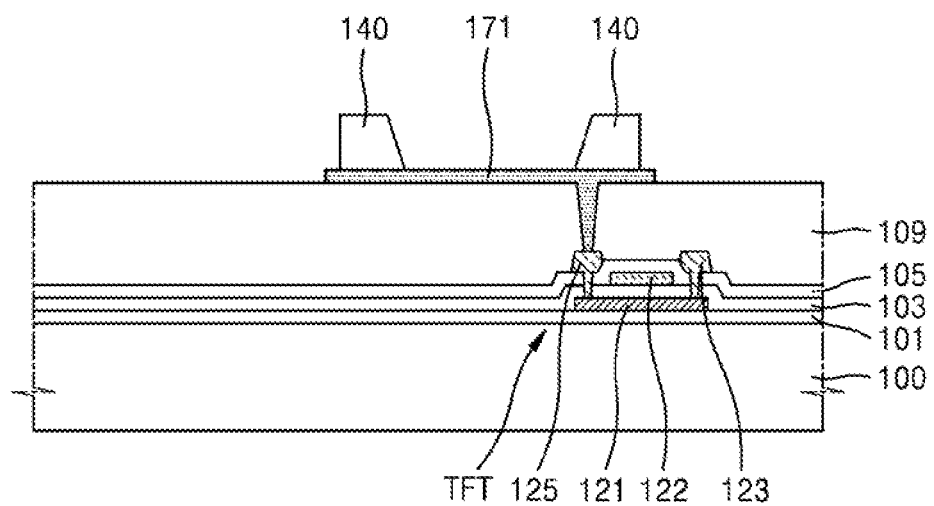
Figure 10C:
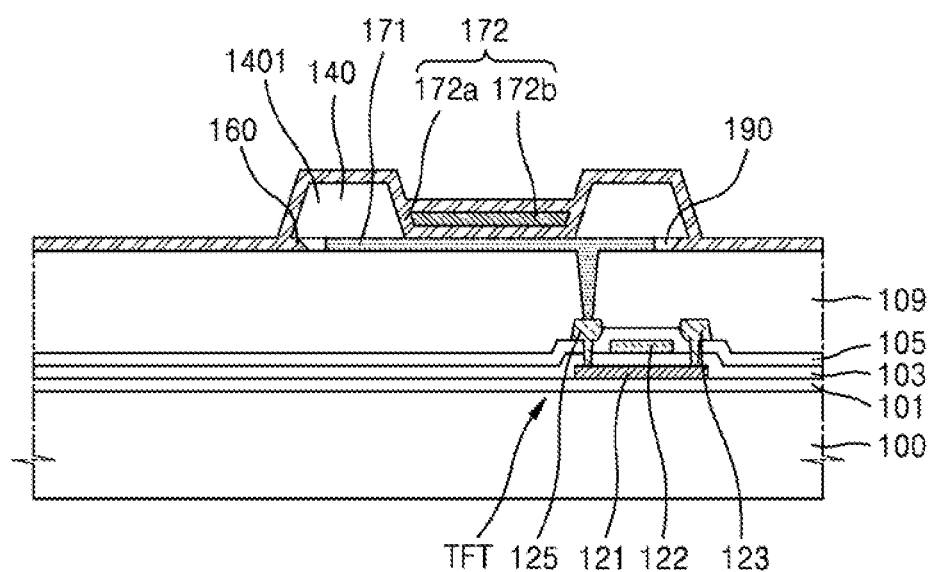

Referring to FIG. 10B the first region A1 remaining on the pixel electrode 171 is completely removed to form the pixel-defining layer 140. Accordingly, the pixel electrode 171 that is to contact the intermediate layer 172 is exposed.

Thus, the pixel electrode 171 and the pixel-defining layer 140 are formed using one mask process. For example, pixel electrode 171 and the pixel-defining layer 140 may be formed using a single mask.

However, because the edge of the pixel electrode 171 is not yet completely covered by the pixel-defining layer 140 but is partially exposed, when electrodes are stacked in this state, the opposite electrode 173 may directly contact an exposed portion of the pixel electrode 171 and thus may short-circuit with the pixel electrode 171 or light leakage may occur.

Accordingly, the edge of the pixel electrode 171 needs to be completely covered.

Accordingly, the pixel-defining layer 140 of FIG. 10B may be heated to flow down so that the pixel-defining layer 140 of FIG. 10C is formed. Then, referring to FIG. 10C, the pixel-defining layer 140 may be formed to cover the entire edge of the pixel electrode 171 using the heat treatment as described with reference to FIG. 108.

The pixel-defining layer 140 may include a protrusion 1401 formed in the heat treatment. In the heat treatment, the pixel-defining layer 140 of FIG. 10B may flow to the outside of the edge of the pixel electrode 171 to form the protrusion 1401. Thus, a portion of the pixel-defining layer 140 may protrude toward the outside of the pixel electrode 171, and thus the pixel-defining layer 140 may include the protrusion 1401.)

Accordingly, an empty space may be generated between the protrusion 1401 and the via insulating layer 109, which is below the protrusion 1401, and the cavity 190 may be formed outside the pixel electrode 171 between the protrusion 1401 and the via insulating layer 109. The empty space may be referred to as the cavity 190.

When the opposite electrode 173 is stacked on the protrusion 1401 and the cavity 190 in this state, the opposite electrode 173 may be short-circuited by the protrusion 1401 and the cavity 190, and thus the protrusion 1401 and the cavity 190 need to be covered and planarized.

Accordingly, referring to FIG. 10C, the intermediate layer 172 may be formed on the upper surface of the pixel electrode 171 to cover the protrusion 1401 and the cavity 190.

According to an exemplary embodiment, the organic light-emitting display apparatus 20 may include the intermediate layer 172 having a common layer 172*a* and an emission layer 172*b*. The common layer 172*a* included in the intermediate layer 172 may be formed to cover the protrusion 1401 and the cavity 190. At this time, part of the common layer 172*a* may form the first protection layer 160 that rounds the edge of the pixel electrode 171. For example, the part of the common layer 172*a* which is in contact with the cavity may be referred to as the first protection layer 160.

For example, when the intermediate layer 172 is formed, the emission layer 172*b* including an organic material that generates light may be formed only between two pixel-defining layers 140 formed on the edge region of the pixel electrode 171, and the common layer 172*a* may be formed to cover the protrusion 1401 and the cavity 190. In an exemplary embodiment, the common layer 172*a* may be formed on the entire surface of the substrate 100.

Accordingly the common layer 172*a* covers entirely the protrusion 1401 of the pixel-defining layer 140 and also covers the cavity 190 as well as the protrusion 1401, and thus the region outside the pixel electrode 171 may be planarized before the opposite electrode 173 is formed.

Thus, in the organic light-emitting display apparatus 20 according to an exemplary embodiment, step coverage of the opposite electrode 173 increases, and a short-circuit of the opposite electrode 173 in the cavity 190 may be prevented.

Figure 10D:
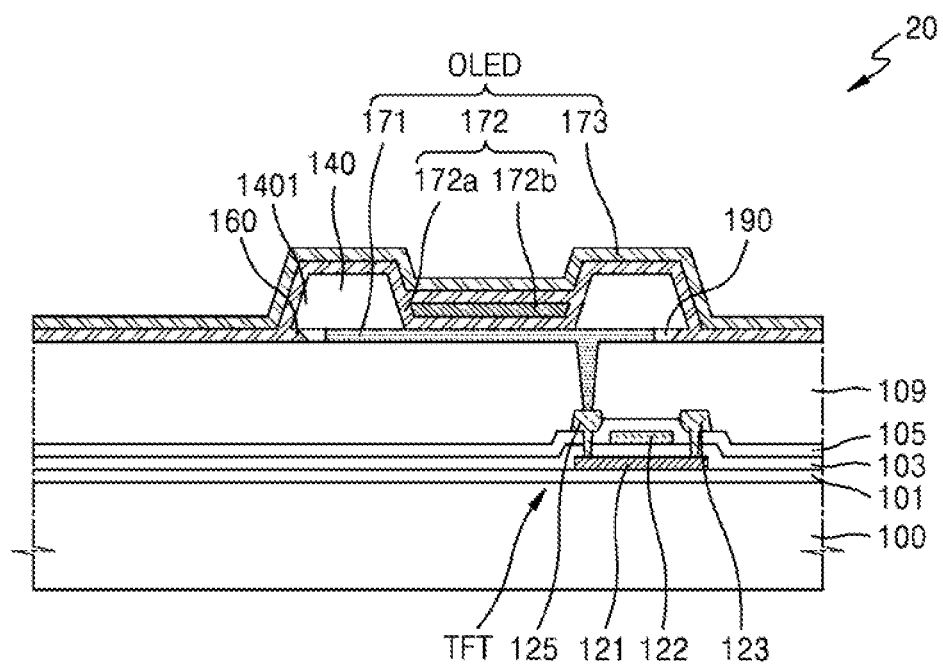

Referring to FIG. 10D, the opposite electrode 173 may be formed on the upper surface of the intermediate layer 172, which covers and planarizes the protrusion 1401 of the pixel-defining layer 140 and the cavity 190.

In the method of manufacturing the organic light-emitting display apparatus 20 according to an exemplary embodiment, since the pixel electrode 171 and the pixel-defining layer 140 are formed according to one mask process. For example, the pixel electrode 171 and the pixel-defining layer 140 are formed using a same mask under the one mask process. The protrusion 1401 of the pixel-defining layer 140 and the cavity 190 formed due to thermal flow according to simultaneous formation of the pixel electrode 171 and the pixel-defining layer 140 may prevent short-circuit between the pixel electrode 171 and the opposite electrode 173.

Organic light-emitting display apparatuses according to exemplary embodiments of the present invention include a first protection layer disposed along the edge of a pixel electrode, and thus may completely shield the edge of the pixel electrode in spite of a process deviation, thereby preventing generation of many defective pixels. Moreover, in methods of manufacturing the organic light-emitting display devices according to exemplary embodiments of the present invention, the pixel electrode and a pixel-defining layer are formed using a single mask. Thus, the organic light-emitting display apparatuses may be manufactured at low cost according to a simple process.

While the present invention has been shown and described with reference to exemplary embodiments thereof, it will be apparent to those of ordinary skill in the art that various changes in form and detail may be made therein without departing from the spirit and scope of the present invention as defined by the following claims.

What is claimed is:

1. An organic light-emitting display apparatus comprising:
    a substrate;
    a thin film transistor disposed on the substrate;
    a via insulating layer covering the thin film transistor and comprising a via hole;
    a pixel electrode disposed on the via insulating layer and electrically connected to the thin film transistor through the via hole;
    a first protection layer surrounding the pixel electrode;
    a pixel-defining layer covering an edge region of the pixel electrode and at least a portion of the first protection layer and to comprise an opening through which an upper surface of the pixel electrode is exposed;
    an opposite electrode facing the pixel electrode;
    an intermediate layer disposed between the pixel electrode and the opposite electrode; and
    a cavity disposed between the first protection layer and the edge of the pixel electrode
    wherein the first protection layer is separated from an edge of the pixel electrode, and
    wherein the intermediate layer comprises:
        an emission layer; and
        a common layer that covers the pixel-defining layer, and
    wherein the first protection layer is part of the common layer.

2. The organic light-emitting display apparatus of claim 1, wherein a center of the pixel electrode coincides with a center of the opening.

3. The organic light-emitting display apparatus of claim 1, wherein the first protection layer comprises an inorganic insulating material or an organic insulating material.

4. The organic light-emitting display apparatus of claim 1, wherein the first protection layer has a shape of a closed loop comprising an inner lateral surface and an outer lateral surface.

5. An organic light-emitting display apparatus comprising:
- a substrate;
- a thin film transistor disposed on the substrate;
- a via insulating layer covering the thin film transistor and comprising a via hole;
- a pixel electrode disposed on the via insulating layer and electrically connected to the thin film transistor through the via hole;
- an emission layer disposed on an upper surface of the pixel electrode;
- a pixel-defining layer disposed on the upper surface of the pixel electrode and surrounding the emission layer;
- an opposite electrode disposed on the emission layer and the pixel-defining layer;
- a recessed region defined by a bottom surface of the pixel electrode, an edge of the pixel electrode and the via insulating layer; and
- a common layer interposed between the opposite electrode and the emission layer on the pixel electrode,
- wherein the opposite electrode is spaced apart from the pixel electrode by the recessed region, wherein the recessed region is a cavity, and
- wherein the common layer covers the pixel-defining layer and the recess region to form the cavity.

* * * * *